US008367975B2

(12) United States Patent
Sugishita et al.

(10) Patent No.: US 8,367,975 B2
(45) Date of Patent: Feb. 5, 2013

(54) TEMPERATURE ADJUSTMENT METHOD

(75) Inventors: Masashi Sugishita, Toyama (JP);
Masaaki Ueno, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 1107 days.

(21) Appl. No.: 12/224,436

(22) PCT Filed: Mar. 5, 2007

(86) PCT No.: PCT/JP2007/054158
§ 371 (c)(1),
(2), (4) Date: Aug. 27, 2008

(87) PCT Pub. No.: WO2007/102454
PCT Pub. Date: Sep. 13, 2007

(65) Prior Publication Data
US 2009/0107978 A1    Apr. 30, 2009

(30) Foreign Application Priority Data

Mar. 9, 2006  (JP) .................................. 2006-063684

(51) Int. Cl.
*B23K 10/00* (2006.01)
(52) U.S. Cl. ......... 219/385; 219/492; 219/497; 392/416
(58) Field of Classification Search ............ 219/121.43, 219/494, 497, 501, 506, 483; 392/416–419; 118/724, 725
See application file for complete search history.

(56) References Cited

U.S. PATENT DOCUMENTS

| 6,951,998 B2 * | 10/2005 | Nanno et al. ................. 219/494 |
| 2002/0055080 A1 * | 5/2002 | Tanaka et al. ................. 432/49 |
| 2003/0121905 A1 * | 7/2003 | Nanno et al. ................. 219/494 |
| 2006/0173646 A1 * | 8/2006 | Tanaka et al. ................. 702/130 |

FOREIGN PATENT DOCUMENTS

| JP | A-09-007963 | 1/1997 |
| JP | A-2000-183072 | 6/2000 |
| JP | A-2002-353153 | 12/2002 |

* cited by examiner

*Primary Examiner* — Mark Paschall
(74) *Attorney, Agent, or Firm* — Oliff & Berridge, PLC

(57) ABSTRACT

A temperature adjustment method is provided to improve operating efficiency and reduce costs. Control of a heating unit in a thermal processing system including a heating control section is performed based on a first output control pattern obtained by subjecting a detection temperature provided by a first temperature detecting unit to an integral operation, a differential operation, and a proportional operation under a condition of a first set of temperature-setting conditions, a second output control pattern obtained by determining a first heat quantity in a period from the start of an increase in temperature detected by a second temperature detecting unit until the temperature inside the processing chamber reaches a maximum temperature, and using a second heat quantity obtained by subtracting the part of the output provided by the proportional operation from the first heat quantity.

20 Claims, 12 Drawing Sheets

TEMPERATURE ADJUSTMENT METHOD

BACKGROUND OF THE INVENTION

1. Field of the Invention

The present invention relates to a temperature adjustment method.

2. Description of the Related Art

Conventionally, in a semiconductor manufacturing apparatus, it is necessary to maintain the temperature inside an oven at a suitable level or to follow specified temperature changes inside the oven. Therefore, a control apparatus controls a heater on the basis of a preset temperature change pattern for a target temperature (see, for example, Japanese Laid-Open Patent Publication No. 2000-183072 (pp. 11 through 21, FIG. 1)

SUMMARY OF THE INVENTION

Using feedback control via a PID operation, which is the prior art, constitutes a follow-up control method in which the controlled variable is changed after it has been detected that the bias between the target value (target temperature) and the actual value has increased. Therefore, a large overshoot or undershoot sometimes occurs, with the result that in some cases a large amount of time is needed to obtain a stable condition. A great amount of adjustment time and expense is therefore required due to the repeated adjustments made by a trained operator in order to reduce the error relative to the target temperature (for example, adjustments of the preset parameters for a PID operation), and this makes it more difficult to improve operating efficiency and to reduce costs.

An object of the present invention, which was devised in order to solve the problems described above, is to provide a temperature adjustment method capable of contributing toward improved operating efficiency and reduced costs.

According to the present invention, there is provided a temperature adjustment method in a thermal processing system comprising a heating unit for heating an interior of a processing chamber for processing a substrate, a heating control section for controlling the heating unit, and first and second temperature detecting units for detecting a temperature inside the processing chamber, wherein the first temperature detecting unit is arranged in a position closer to the substrate than the second temperature detecting unit; and the second temperature detecting unit is arranged in a position closer to the heating unit than the first temperature detecting unit, the temperature adjustment method comprising:

a step of determining by said heating control section, in a process where control is performed based on a first output control pattern obtained by subjecting a detection temperature provided by the first temperature detecting unit to an integral operation, a differential operation, and a proportional operation under a condition of a first set of temperature-setting conditions, a second output control pattern by determining a first (*1) heat quantity in the period from the start of an increase in the temperature detected by the second temperature detecting unit until the time at which the temperature inside the processing chamber reaches a maximum temperature, and using a second heat quantity obtained by subtracting the part of the output provided by the proportional operation from the first heat quantity; and a correction step of correcting, in a case in which a second set of temperature-setting conditions during temperature control in a subsequent cycle is different from at least one condition of the first set of temperature-setting conditions, a portion corresponding to the different condition by using the second output control pattern.

According to the present invention, it is possible to provide a temperature adjustment method capable of contributing toward achieving improved operating efficiency and reduced costs.

DESCRIPTION OF THE PREFERRED EMBODIMENTS

Embodiments of the present invention will now be described with reference to the drawings. The present invention relates to an automatic temperature adjustment procedure in a control scheme for controlling a control amount output from the heating unit, by using feedback control based on performing proportional/integral/differential (PID) operations on a controlled variable to be input to the heating unit in the process of controlling the temperature in a thermal processing system.

First Embodiment

Figure 1:
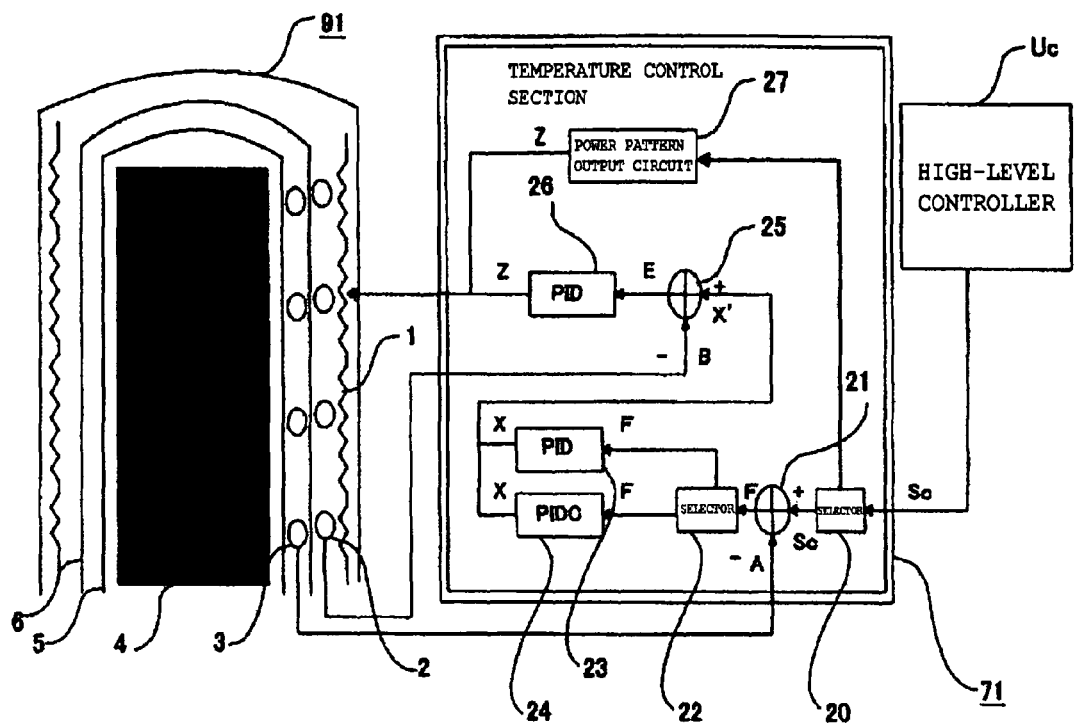
FIG. 1 is a functional block diagram showing a thermal processing system according to a first embodiment of the present invention.
Figure 2:
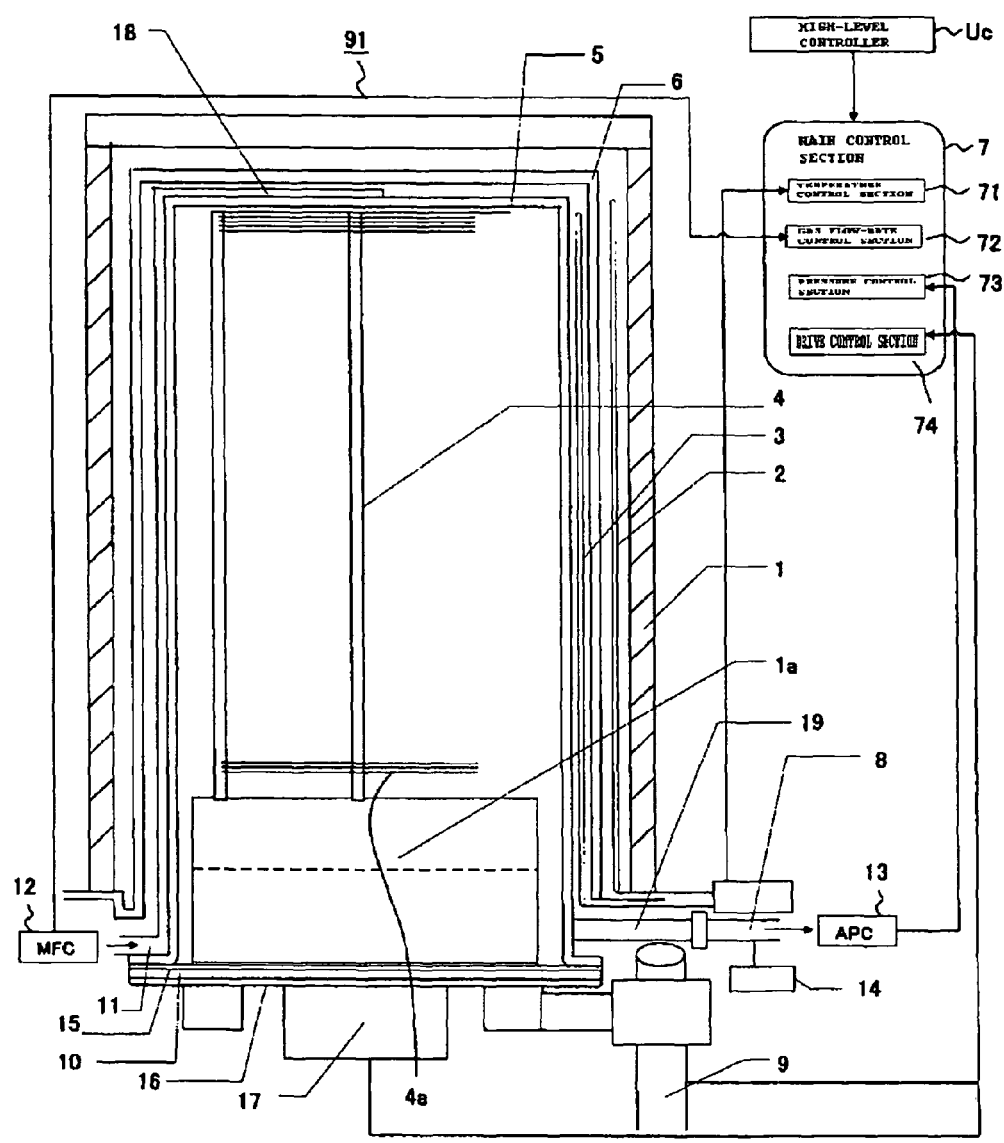
FIG. 2 is a view showing the details of a structure on the periphery of a reactor tube in a thermal processing system according to the first embodiment of the present invention.

FIG. 1 is a functional block diagram showing the thermal processing system according to a first embodiment of the present invention. FIG. 2 is a view showing the details of a structure on the periphery of a reactor tube of the same system.

Thermal Processing System

The thermal processing system according to this embodiment has a processing oven 91 and a main control section 7. In FIG. 1, only a temperature control section 71 is shown as part of the main control section 7.

Structure of the Processing Oven

The processing oven 91 includes a heater (heating unit) 1, a quartz cap 1a, a heater thermocouple 2, a cascade thermocouple 3 (temperature detecting unit) 3, a boat 4, a reaction tube 5, a soaking tube 6, a exhaust tube 8, a boat elevator 9, a base 10, a gas supply tube 11, a mass flow controller (MFC) 12, a pressure regulator (APC) 13, a pressure sensor 14, an O-ring 15, a seal cap 16, a rotary shaft 17, an introduction port 18, and an exhaust port 19.

The main control section 7 has a temperature control section (heating control section) 71, a gas flow-rate control section 72, a pressure control section 73, and a drive control section 74.

The soaking tube 6 is composed, for example, of a heat-resistant material such as SiC and is shaped in the form of a cylinder having an upper end closed and a lower end opened. The reactor vessel (hereinafter, the reactor tube 5), which is composed, for example, of a heat-resistant material such as quartz ($SiO_2$) is formed in a cylindrical form having an opening in a lower end thereof, and is arranged in the soaking tube 6 concentrically with the soaking tube 6. The exhaust tube 8 and the gas supply tube 11 composed, for example, of quartz, are coupled with a lower part of the reactor tube 5. The introduction port 18, which is coupled with the gas supply tube 11, is structured to rise in the form of, for example, a capillary tube from the lower part of the reactor tube 5 and along the side part of the reactor tube 5, and to reach the interior of the reactor tube 5 in the ceiling portion. The exhaust tube 8 is connected to the exhaust port 19 of the reactor tube 5. The gas is allowed to pass from the gas supply tube 11 through the ceiling part of the reactor tube 5, to flow into the interior of the reactor tube 5, and to exit from the exhaust tube 8 connected to the lower part of the reactor tube 5.

The introduction port 18 of the reactor tube 5 is arranged so that a processing gas is supplied into the reactor tube 5 through the gas supply tube 11. The gas supply tube 11 is coupled with the mass flow controller (MFC) 12 serving as a gas flow-rate controlling unit, or to a moisture generator, which is not shown in the drawing. The mass flow controller 12 is connected to the gas flow-rate control section 72 and is structured to be able to control the flow rate of a supply gas or vapor ($H_2O$) to a prescribed amount.

The gas, flowing in the reactor tube 5, is exhausted from the exhaust port 19 of the reactor tube 5. The gas exhaust tube 8, coupled with the pressure regulator (for example, APC) 13, is connected to the exhaust port 19 of the reactor tube 5. The pressure inside the reactor tube 5 is detected by a pressure detecting unit (hereinafter, pressure sensor 14). The APC 13 is controlled by the pressure control section 73 so as to bring the pressure inside the reactor tube 5 to a prescribed pressure.

A discoid support (hereinafter, base 10) composed, for example, of quartz is removably provided to an opening part at the lower edge of the reactor tube 5 while being able to be hermetically sealed via the O-ring 15. The base 10 is attached on a discoid lid (hereinafter, seal cap 16). Also, the seal cap 16 is coupled with a rotating unit (hereinafter, rotary shaft 17), and the support (hereinafter, quartz cap 1a), the substrate holding unit (hereinafter, boat 4), and the substrate (hereinafter, wafer 4a) held on the boat 4 are caused to rotate by the rotary shaft 17. Also, the seal cap 16 is coupled with elevation unit (hereinafter, boat elevator 9) and is structured to allow the boat 4 to be elevated and lowered. The rotary shaft 17 and the boat elevator 9 are controlled by the drive control section 74 so as to be driven at a prescribed speed.

The heating unit (hereinafter, heater 1) is concentrically arranged around the reactor tube 5. The temperature of the heater 1 is detected by a temperature detecting unit (hereinafter, heater thermocouple 2 and cascade thermocouple 3) so as to bring the temperature inside the reactor tube 5 to a processing temperature set by a high-level controller Uc, and the heater is controlled by the temperature control section 71. Here, the heater thermocouple 2 serves to detect the temperature of the heater 1, and the cascade thermocouple 3 serves to detect the temperature between the soaking tube 6 and the reactor tube 5. Specifically, the heater 1 is divided into a plurality of zones (for example, U zone, CU zone, CL zone, L zone, and the like) in order to more accurately control the temperature inside the oven. Based on deviations between the temperature setting and the temperature detection values from the plurality of heating zones formed by the heater 1, a power control signal is output to the heater for each heating-zone, and the temperature is controlled. Incidentally, the heater thermocouple 2 and the cascade thermocouple 3 each have a plurality of detecting points so that detection can be made in zone-specific positions so as to correspond to the plurality of zones of the heater 1.

Here, the cascade thermocouple 3 is arranged between the reactor tube 5 and the boat 4 and is configured so as to also be capable of detecting the temperature inside the reactor tube 5. However, the cascade thermocouple 3 and the heater thermocouple 2 may be both arranged between the heater 1 and the wafer 4a, whereby the cascade thermocouple 3 is arranged closer to the wafer 4a than the heater thermocouple 2, and the heater thermocouple 2 is arranged closer to the heater 1 than the cascade thermocouple 3.

Example of Oxidation and Diffusion Processing Method in Which Processing Oven is Used An example of an oxidation and diffusion processing method in the processing oven 91 is described next. At first, the boat 4 is lowered by the boat elevator 9. The boat 4 holds a plurality of wafers 4a. The temperature inside the reactor tube 5 is then raised to a prescribed temperature while heating is performed by the heater 1. An inert gas is delivered in advance in the reactor tube 5 by the MFC 12 connected to the gas supply tube 11, the boat 4 is elevated by the boat elevator 9 and is moved inside the reactor tube 5, and the internal temperature of the reactor tube 5 is maintained at a prescribed processing temperature. The inside of the reactor tube 5 is kept at prescribed pressure, and the boat 4 and the wafers 4a held on the boat 4 are then caused to rotate by the rotary shaft 17. Simultaneously, a processing gas is supplied through the gas supply tube 11, or vapor is supplied by the moisture generator. The supplied gas descends the reactor tube 5 and is uniformly supplied to the wafers 4a.

Inside the reactor tube 5 in which the oxidation/diffusion process is underway, the oxidation/diffusion process is performed for a prescribed period of time while the reactor tube is exhausted through the exhaust tube 8 and the pressure is controlled to a prescribed pressure by the APC 13.

After the oxidation/diffusion process is completed in this manner, the gas in the reactor tube 5 is replaced with an inert gas in order to shift to the oxidation/diffusion process for the next wafer 4a, and the pressure is returned to the normal pressure. Thereafter, the boat 4 is lowered by the boat elevator 9, and the boat 4 and the processed wafers 4a are taken out of the reactor tube 5. The processed wafers 4a on the boat 4 taken out of the reactor tube 5 are replaced with the unprocessed wafers 4a, which are again elevated into the reactor tube 5 in the same manner as described above, and an oxidation/diffusion process is performed.

Description of the Temperature Controller

The temperature control section 71 shown in FIG. 1 will be described next. Although the temperature control section 71 controls the heater 1, the cascade thermocouple 3, and the heater thermocouple 2 according to the respective heating zones described above, the following description is stated in terms of one of those heating zones, unless specified otherwise.

The temperature control section 71 is configured with selectors 20 and 22, subtracters 21 and 25, PID operators 23 and 26, a PIDC operator 24, and a power-pattern output circuit 27.

The selector 20 selectively switches the control scheme in accordance with the established control mode. Specifically, a selective switch is made between PID control (described below), power control (described below), and the like.

The subtracter 21 calculates, as a deviation F, the result of subtraction of a control amount (detected temperature) A from a target value Sc established at the high-level controller Uc, and outputs the deviation to the PID operator 23 or the PIDC operator 24 by way of the selector 22.

The selector 22 is a unit for selectively switching over the control scheme, in accordance with the control mode established. Specifically, it selectively switches between PIDC control (described below) and PID control.

The process (PID control) in the PID operator 23 is subsequently described on the basis of FIG. 3.

Description of the PID Operator

Figure 3:
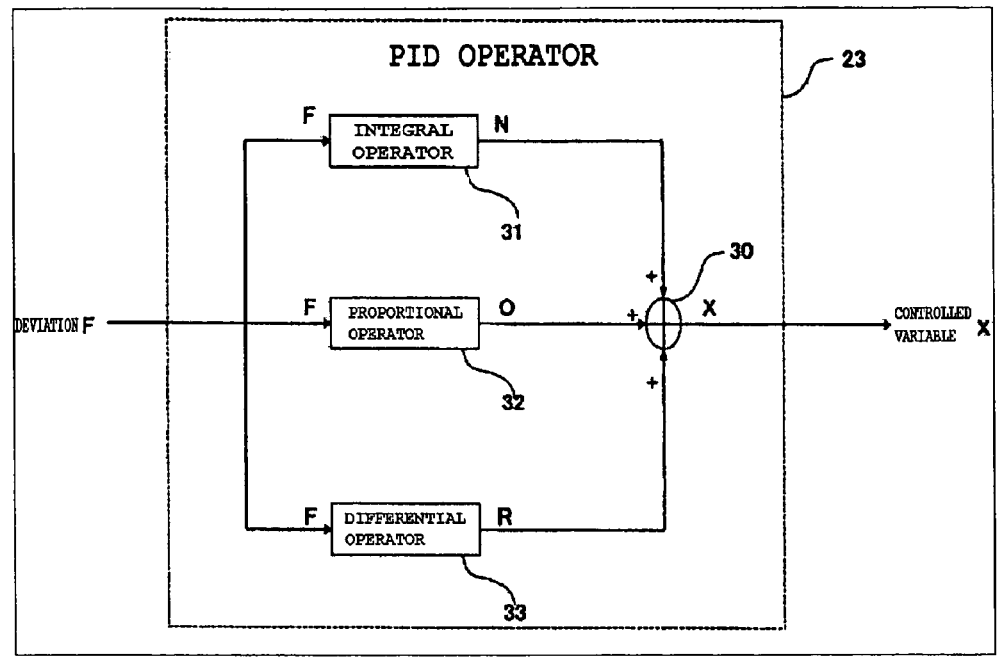
FIG. 3 is a view showing the process (PID control) in a PID operator 23 according to the first embodiment of the present invention.

As shown in FIG. 3, the PID operator 23 is configured with an adder 30, an integral operator 31, a proportional operator 32, and a differential operator 33. The integral operator 31 receives the deviation F as input, and outputs, as an integral value N, the value obtained by multiplying a preset parameter Ki to the result obtained by the time integration (I-operation) of the deviation F. Provided that the deviation F at a particular time t is represented as F(t) and the integral value N at that time is represented as N(t), the integral value N can be determined according to Eq. (1). In Eq. (1), the integration range of ∫F(u)du lies between 0 and t.

$$N(t)=Ki \cdot \int F(u)du \quad (1)$$

The proportional operator 32 receives the deviation F as input, and outputs a multiple (P-operation) of a preset parameter Kp as a proportional value O. Provided that the deviation F at a particular time t is represented as F(t) and the proportional value O at that time is represented as O(t), the proportional value O can be determined according to Eq. (2).

$$O(t)=Kp \cdot F(t) \quad (2)$$

The differential operator 33 receives the deviation F as input, and outputs, as a differential value R, the value obtained by multiplying a preset parameter Kd to the result obtained by the time differentiation (D-operation) of the deviation F. Provided that the deviation F at a particular time t is represented as F(t) and the differential value R at that time is represented as R(t), the differential value R can be determined according to Eq. (3).

$$R(t)=Kd \cdot dF(t)/dt \quad (3)$$

The adder 30 receives the integral value N, the proportional value O, and the differential value R as inputs, calculates the sum of these values, and outputs a controlled variable X. Provided that the deviation F at a particular time t is represented as F(t) and the controlled variable X at that time is represented as X(t), the controlled variable X can be determined from Eqs. (1), (2), and (3) in accordance with Eq. (4). Such an arithmetic process in the PID operator 23 is referred to as a PID operation. In Eq. (4), the integration range of ∫F(u)du lies between 0 and t.

$$X(t)=Kp \cdot F(t)+Ki \cdot \int F(u)du+Kd \cdot dF(t)/dt \quad (4)$$

Specifically, as shown in FIGS. 1 and 2, the target value (target temperature) Sc from the high-level controller Uc and the controlled variable (detected temperature) A from the cascade thermocouple 3 are input to the temperature control section 71 of the main control section 7. The subtracter 21 in the temperature control section 71 outputs a deviation F obtained by subtracting the controlled variable A from the target value (target temperature) Sc. The PID operator 23 performs a PID operation by using the deviation F, and determines a controlled variable X. The controlled variable X is converted into a target value X' so that the target value X' and the controlled variable (detected temperature) B from the heater thermocouple 2 are input to the subtracter 25. The subtracter 25 outputs a deviation E obtained by subtracting the controlled variable B from the target value X'. The PID operator 26 performs a PID operation by using the deviation E, and outputs a controlled variable Z as an output of the temperature control section 71, and the variable is input to the heater 1. The controlled variables A and B that have been output from the heater 1 are fed back to the temperature control section 71. The controlled variable Z output from the temperature control section 71 in this manner is varied in real time so that the deviation F between the target value Sc and the controlled variable A is zero. Such a control scheme is referred to as PID control.

Description of the PIDC Operator

The PIDC operator will subsequently described with reference to FIG. 4.

Figure 4:
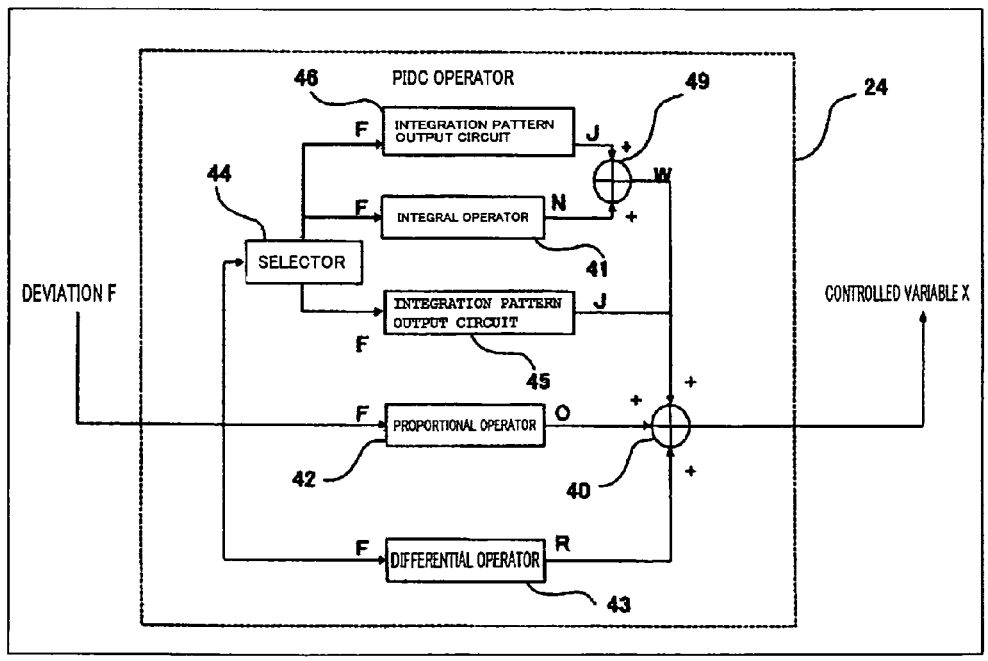
FIG. 4 is a view showing a PIDC operator according to the first embodiment of the present invention.

As shown in FIG. 4, the PIDC operator 24 is configured with an adder 40, an integral operator 41, a proportional operator 42, a differential operator 43, a selector 44, an integration pattern output circuit 45, and an integration pattern output circuit 46.

The selector 44 performs a selective switch on the basis of a preset control switchover time. Specifically, a switch is made to the integration pattern output circuit 45 or the integration pattern output circuit 46 plus the integral operator 41 at a preset time t from the start of the control.

The integral operator 41 receives the deviation F as input, and outputs, as an integral value N, the value obtained by multiplying a preset parameter Ki to the result obtained by the time integration (I-operation) of the deviation F. Provided that the deviation F at a particular time t is represented as F(t) and the integral value N at that time is represented as N(t), the integral value N can be determined according to Eq. (5). In Eq. (5), the integration range of ∫F(u)du lies between 0 and t.

$$N(t)=Ki\cdot\int F(u)du \tag{5}$$

Here, the term "integral output pattern," rather than referring to an integral output portion, refers to a value obtained by matching the output value of the integral output portion with the process in advance, and the integration pattern output circuits 45 and 46 output an integration pattern value J based on a preset output pattern.

Figure 5:
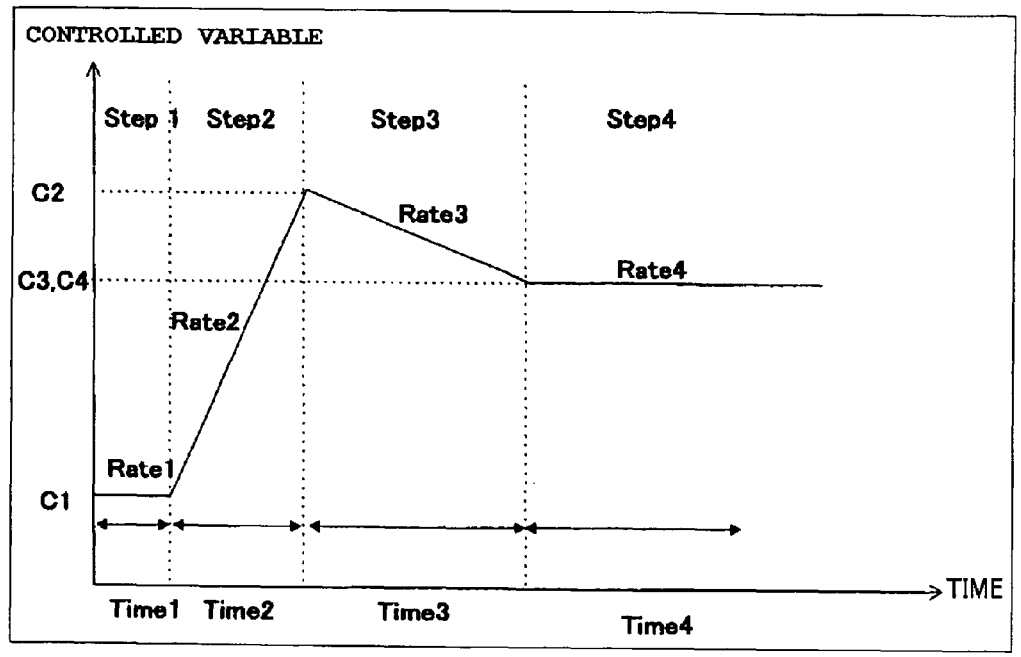
FIG. 5 is a view showing an integral output pattern according to the first embodiment of the present invention.

FIG. 5 is a view showing an integral-output pattern. The high-level controller Uc is able to set an output value C, a rate, and a time for each of a plurality of steps (steps 1 to 4) when temperature control is performed. Provided that a certain step is an I-th step, the output value C(I−1) in the preceding step is changed at a rate (I) to an output value C(I), and the output value continues to be output at C(I) without changing the output value C(I). After the start of the I-th step, the process proceeds to the (I+1)-th step after time (I) has elapsed. The integral-output pattern value J at a particular time t is assumed to be J(t).

The adder 49 receives as an input the integration pattern value J from the integration pattern output circuit 46 and the integral value N from the integral operator 41, calculates the sum of these, and outputs an integral controlled variable W.

Namely, provided that the deviation F at a particular time t is represented as F(t) and the integral controlled variable W at that time is represented as W(t), the integral controlled variable W can be determined according to Eq. (6) when the selector 44 switches between the integration pattern output circuit 45 and the integration pattern output circuit 46 plus the integral operator 41. The integral controlled variable W is given as a sum of an integration pattern value (J(t)) and an integral operation value. In Eq. (6), the integration range of ∫F(u)du lies between 0 and t.

$$W(t)=J(t)+Ki\int F(u)du \tag{6}$$

The proportional operator 42 receives the deviation F as input, and outputs a multiple (P-operation) of a preset parameter Kp as a proportional value O. Provided that the deviation F at a particular time t is represented as F(t) and the proportional value O at that time is represented as O(t), the proportional value O can be determined according to Eq. (7).

$$O(t)=Kp\cdot F(t) \tag{7}$$

The differential operator 43 receives the deviation F as input, and outputs, as a differential value R, a value obtained by an operation in which the result of the time differentiation (D-operation) of the deviation F is multiplied by a preset parameter Kd. Provided that the deviation F at a particular time t is represented as F(t) and the differential value R at that time is represented as R(t), the differential value R can be determined according to Eq. (8).

$$R(t)=Kd\cdot dF(t)/dt \tag{8}$$

The adder 40 receives the integral controlled variable W or integration pattern value J, the proportional value O, and the differential value R as input, calculates the sum of these values, and outputs the result as a controlled variable X. Provided that the deviation F at a particular time t is represented as F(t), and the controlled variable X at that time is represented as X(t), the controlled variable X can be determined from Eqs. (6), (7), and (8) above in accordance with Eq. (9a) or (9b). This is referred to as a PIDC operation.

$$X(t)=W(t)+KpF(t)+Kd\cdot dF(t)/dt \tag{9a}$$

$$X(t)=J(t)+KpF(t)+Kd\cdot dF(t)/dt \tag{9b}$$

Namely, as shown in FIG. 1, when the target value Sc from the high-level controller Uc and the control amount A from the cascade thermocouple 3 are input to the temperature control section 71, the subtracter 21 of the temperature control section 71 outputs a deviation F obtained by subtracting the control amount A from the target value Sc. When the deviation F is input to the PIDC operator 24 by the selector 22, the PIDC operator 24 determines a controlled variable X by using the deviation F, a preset integration pattern integrated value, a proportional differential operator, and the like. The controlled variable X is converted into a target value X', and the target value X' and the controlled variable B from the heater thermocouple 2 are inputted to the subtracter 25. The subtracter 25 outputs a deviation E obtained by subtracting the controlled variable B from the target value X'. The PID operator 26 performs a PID operation by using the deviation E, and outputs a controlled variable Z as an output of the temperature control section 71, and the variable is input to the heater 1. The controlled variables A and B that have been output from the heater 1 are fed back to the temperature control section 71. The controlled variable Z that is output from the temperature control section 71 in this manner is varied in real time so that the deviation F between the target value Sc and the control amount A is zero. Such a control scheme is referred to as PIDC control.

Description of the Power Pattern Output Circuit

The power-pattern output circuit 27 will next be described. Here, the term "power pattern," rather than referring to a heater output value that includes an integral operation portion, a differential operation portion, and a proportional operation portion, refers to a value obtained by matching the heater output value that includes an integral operation portion, a differential operation portion, and a proportional operation portion with the process in advance, and the power pattern output circuit 27 outputs the controlled variable Z based on a preset pattern.

Figure 6:
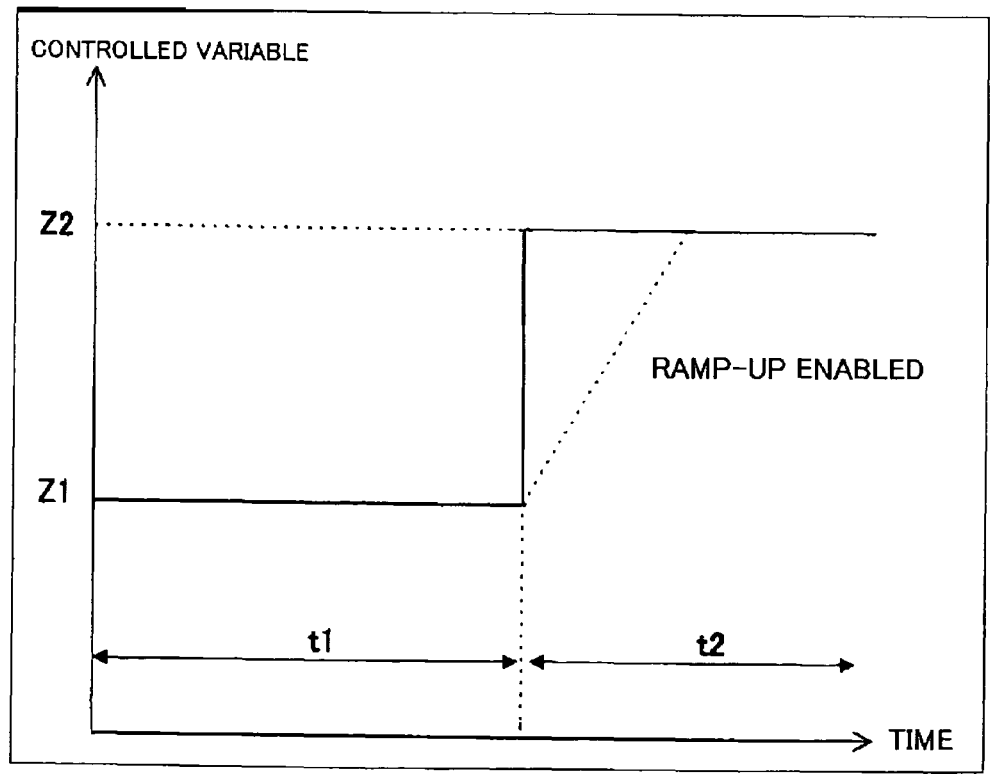
FIG. 6 is a view showing power control according to the first embodiment of the present invention.

Specifically, a certain constant controlled variable Z1 is output at a particular time t1, and a certain constant controlled variable Z2 is output during a particular time t2 after of t1 has elapsed, as shown in FIG. 6, for example. On this occasion, ramping can be performed at a preset slope (controlled variable/time) at the time of a shift from the controlled variable Z1 to the controlled variable Z2. The control scheme in which a controlled variable is thus determined and output based on a pattern created in advance by using the time, the controlled variable, and the slope is referred to as power control.

Temperature Adjustment Method

Figure 7:
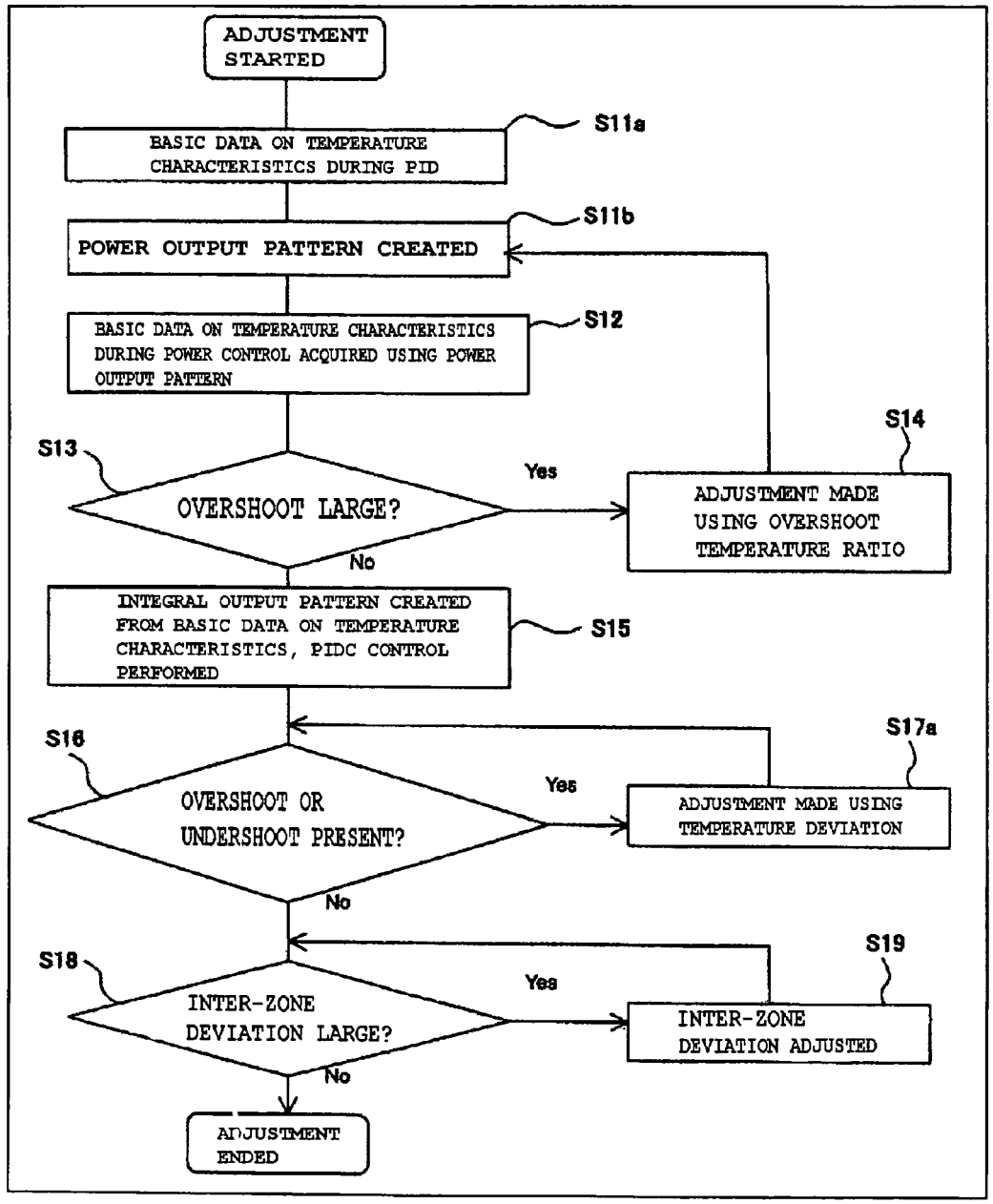
FIG. 7 is a flowchart showing the procedure in a temperature adjustment method according to the first embodiment of the present invention.

FIG. 7 is a flowchart showing the temperature adjustment method according to the present embodiment. Described herein is the case in which the initial temperature S is ramped up to a target temperature S', and a stable process is established. The term "ramp-up" refers to a temperature increase step.

Using the standard PID parameters (Ki, Kp, Kd) described above in relation to PID control, the temperature of the heater 1 is controlled by the temperature control section 71 so that the temperature detected by the cascade thermocouple 3 eventually reaches a prescribed target temperature (first step), and basic data on temperature characteristics (temperature data detected by the cascade thermocouple 3) is acquired (S11*a*).

Figure 8:
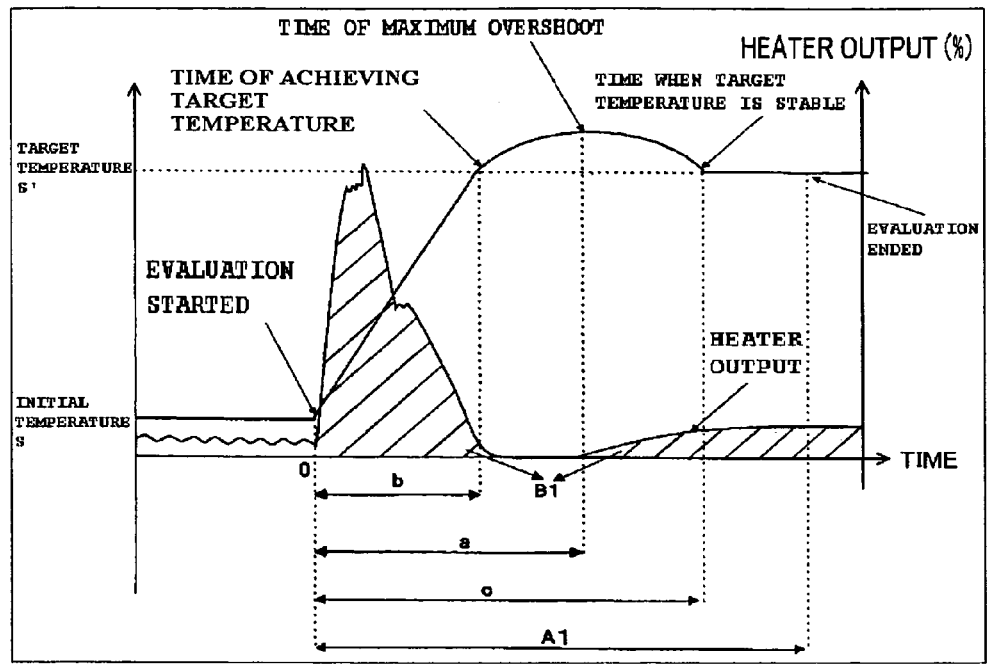
FIG. 8 is a view showing the parameters determined based on the basic data on temperature characteristics according to the first embodiment of the present invention.

A temperature adjustment estimation time A1 (min) (based on the temperature measured by the cascade thermocouple) from a ramp-up start is then determined based on the basic data on temperature characteristics, as shown in FIG. 8, and the following quantities are also determined: the maximum overshoot time (time from the ramp-up start to the time at which the overshoot reaches a maximum) a (min) for the temperature exhibited by the cascade thermocouple 3; the time b (min) at which the temperature inside the reaction tube reaches a target-temperature S'; the time c (min) at which the target temperature S' is stable; and the controlled variable "d" (%) reached at the time at which the target temperature is stable. The following quantities are also determined: the controlled variable e(t) (%) for each moment during the temperature adjustment estimation time A1, the temperature f(t) (° C.) (not shown) indicated by the heater thermocouple 2, and the temperature g(t) (° C.) indicated by the cascade thermocouple 3.

Determined subsequently is the total heat quantity B1 (%*min) during the temperature adjustment estimation time A1 for the temperature (hereinafter, referred also to as cascade temperature) indicated by the cascade thermocouple 3. In Eq. (10), the integration range of ∫e(t)dt lies between 0 and A1.

$$B1=\int e(t)dt \quad (10)$$

C1 can be determined by an Eq. (11) below, provided that the total heat quantity in the temperature adjustment estimation time A1 is a stable heat quantity C1 (%*min) in a case in which it is assumed that stability is achieved at the target temperature S' over the entire range covered by the temperature adjustment estimation time A1, and that the only output quantity is the controlled variable "d" obtained at the time at which the target temperature S' is stable.

$$C1=d*A1 \quad (11)$$

Using the B1 and C1 determined from Eqs. (10) and (11), it is possible for the heat quantity determined by Eq. (12) below to be set as a heat quantity D1 (%*min) during a temperature increase.

$$D1=B1-C1 \quad (12)$$

The heat quantity during a temperature increase will now be described. The heat quantity determined by a PID operation until stability is achieved after the initial temperature starts increasing to a desired target temperature S' includes two types of heat quantities: the heat quantity required to stably maintain the target temperature S', and the heat quantity required to raise the temperature to the target temperature while following the set value.

Therefore, the heat quantity required for raising the temperature; that is, the heat quantity during a temperature increase, is obtained by subtracting, from the total heat quantity determined by Eq. (10), the stable heat quantity in a case in which it is assumed that continued output has been provided for the controlled variable when the target temperature is kept stable.

As described above, the temperature rises while the set value is followed from the start of the temperature increase until the temperature inside the reaction tube reaches the target temperature. However, when the heat quantity during a temperature increase is excessively great, an overshoot results wherein the temperature continues to rise beyond the target temperature. The overshoot is a phenomenon that is not necessary for temperature control and must be prevented as much as possible. Of the total heat quantity, it is the heat quantity during a temperature increase rather than the stable heat quantity that includes overshoot factors, and the inside of the oven can be rapidly stabilized at an ideal temperature by using an output pattern that reflects the heat quantity ratio of the overshoot included in the heat quantity during a temperature increase.

Figure 9:
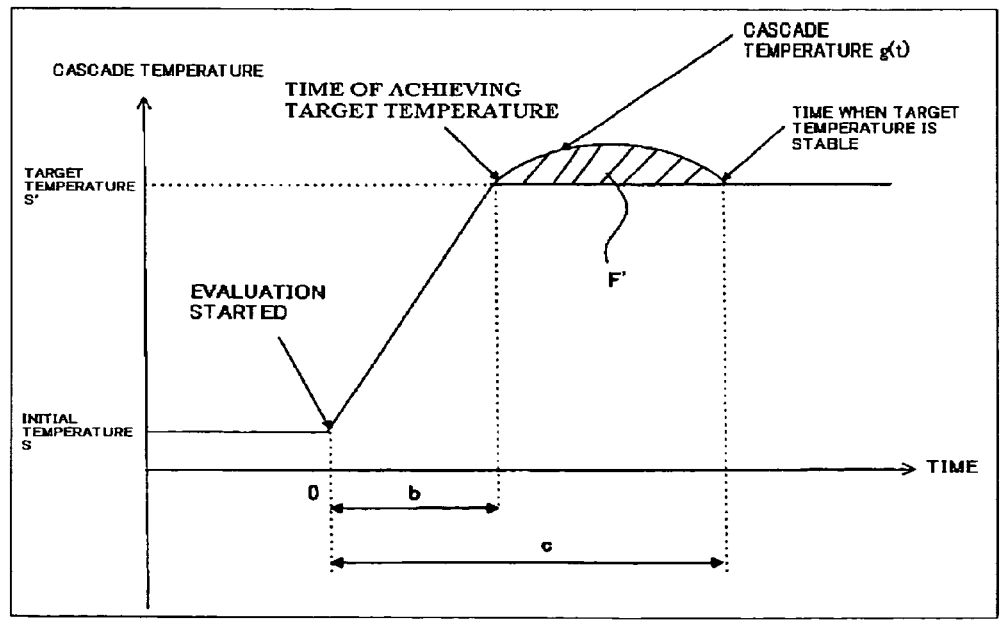
FIG. 9 is a view showing the sum total of overshot cascade temperatures according to the first embodiment of the present invention.

Then, as shown by the hatching in FIG. 9, a determination is made of the sum total of the cascade temperatures at which overshoots occur in the period between the time b at which the temperature inside the reaction tube reaches the target temperature S' after the start of estimation, and the time c at which the target temperature S' is stabilized. F' can be determined using Eq. (13) below, where F' is the sum total of overshoot temperatures. In Eq. (13), the integration range of ∫g(t)dt lies between b and c.

$$F'=\int g(t)dt-S^**(c-b) \quad (13)$$

Figure 10:
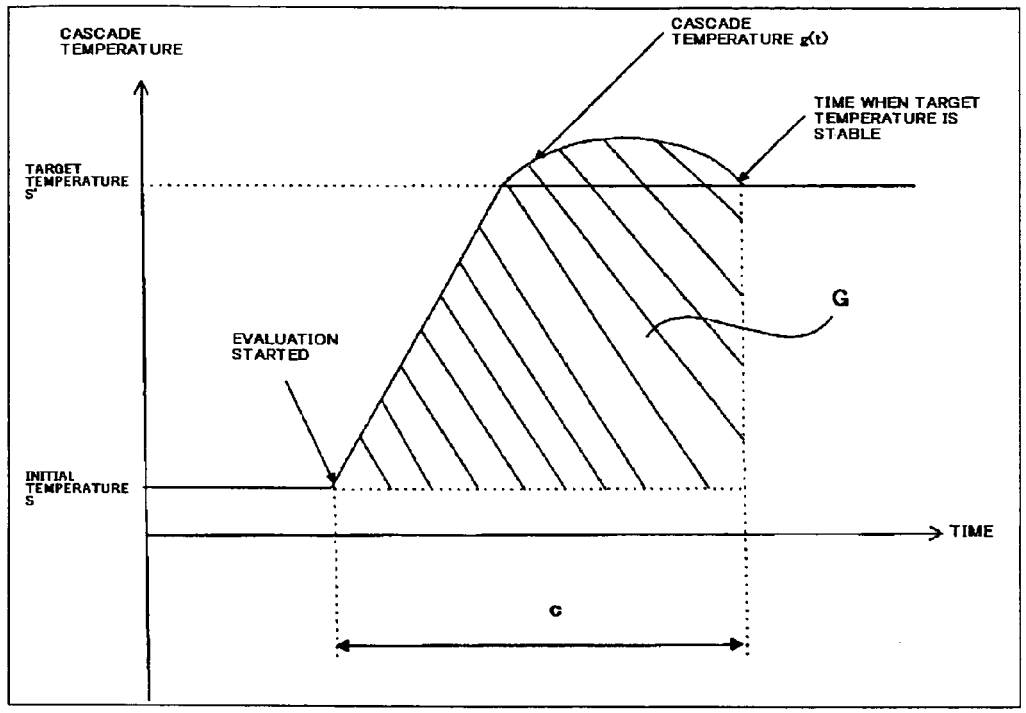
FIG. 10 is a view showing the sum total of temperatures in the period from the start of estimation to the time c at which the target temperature S' is stable according to the first embodiment of the present invention.

Then, as shown by the hatching in FIG. 10, the sum total is determined for the temperatures between the start of estimation and the time c at which the target temperature S' is stabilized. G can be determined by Eq. (14) below, where G is the sum total of temperatures. In Eq. (14), the integration range of ∫g(t)dt lies between 0 and c.

$$G=\int g(t)dt-S^**c \quad (14)$$

Then, the overshooting temperature ratio H (%) is determined. This is the ratio of the sum total F' of overshoot temperatures relative to the sum total G of temperatures, as shown in FIG. 10. Accordingly, it can be determined using Eq. (15) below that $$H=F'/G \quad (15)$$

The portion corresponding to the overshooting temperature ratio H is a ratio of the heat quantity related to the overshoot factor included in the heat quantity D1 during a temperature increase. This fact can thereby be reflected in the heat quantity D1 during a temperature increase by subtracting a portion corresponding to the overshooting temperature ratio H from the heat quantity D1 during a temperature increase, whereby the overshoot can be suppressed and the inside of the furnace can be rapidly stabilized at an ideal temperature. D1' can be determined using Eq. (16) below, where D1' is the heat quantity during a temperature increase that is reduced in accordance with the overshooting temperature ratio H.

$$D1'=D1*(1-H) \quad (16)$$

Using "a," "d," and "D1'" as determined above, a power output pattern (corresponding to a first output control pattern) is determined (second step), and power control is performed (third step). Namely, based on the temperature detected by the cascade thermocouple in the heater control in the first step, the controlled variable for controlling the heater is patterned to determine the first output control pattern, and the heater is controlled based on the first output control pattern.

Figure 11:
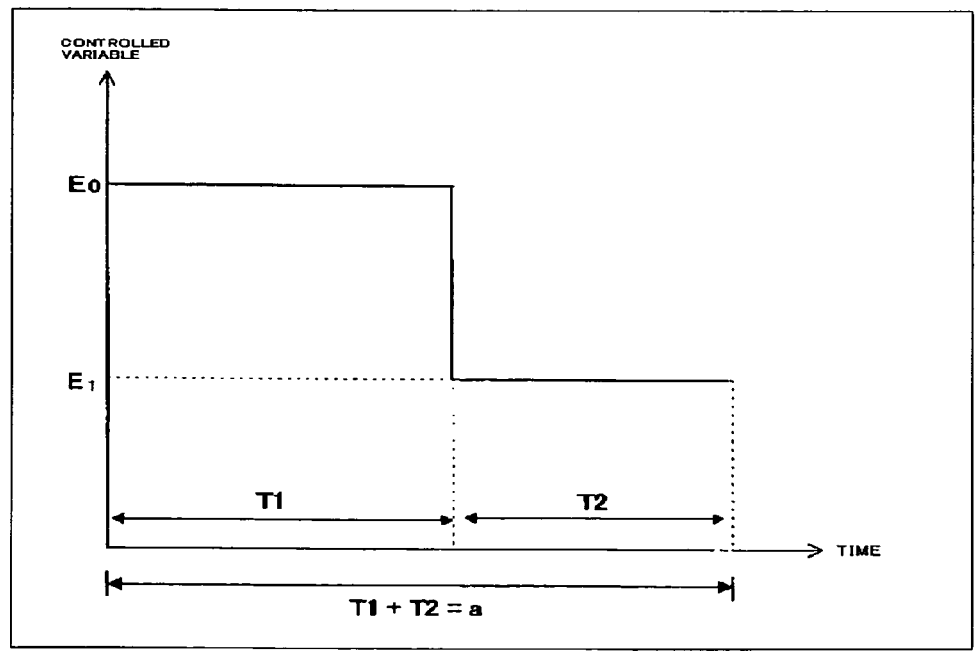
FIG. 11 is a view showing the relationship between a controlled variable and time according to the first embodiment of the present invention.

The pattern shown in FIG. 11 is determined as a power output pattern (S11b). The parameters in FIG. 11 can be determined using Eqs. (17) to (20) below, where "h" is the ramp-up rate (° C./min) during a temperature increase. The term "ramp-up rate" refers to a temperature increase rate (slope). For example, the ramp-up rate achieved when the temperature is raised from 100° C. to 200° C. in 5 minutes is (200° C.−100° C.)/5 minutes=20° C./min.

$$E0=(D1'/T1)+d \quad (17)$$

$$E1=d \quad (18)$$

$$T1=(S'-S)/h \quad (19)$$

$$T2=a-T1 \quad (20)$$

In these equations, E0 is a value obtained by assuming that the heat quantity D1' during a temperature increase is a constant output quantity and dividing D1' by the time corresponding to the time T1 at which the initial temperature S reaches the target temperature S', and then adding the controlled variable "d" (%) observed at the time at which the target temperature is stabilized (for example, the controlled variable at the time T1). S represents the initial temperature.

At T1 and thereafter, only the controlled variable "d" observed at the time at which the target temperature is stabilized can be output until the time (maximum overshoot time) a (min) at which the cascade temperature reaches the maximum temperature.

By using the power output pattern, it is possible to obtain the temperature waveform of a heater thermocouple 2 capable of following the ramp-up rate "h" and being rapidly stabilized. The pattern can be acquired as data on the temperature characteristics at the time of power control (S12).

The overshoot value is then determined for the data on the basic temperature characteristics at the time of power control (S13). In a case where the overshoot value is greater than a preset allowable overshoot value (S13, "Yes"), Eqs. (13) to (20) above are used to modify the power output pattern on the basis of the ratio of the entire temperature waveform and the overshoot portion, and adjustments are made so that the overshoot is reduced (S14). Power control is repeated (third step) based on the power output pattern thus modified, and data for temperature characteristics at the time of control is acquired (S12).

Figure 12:
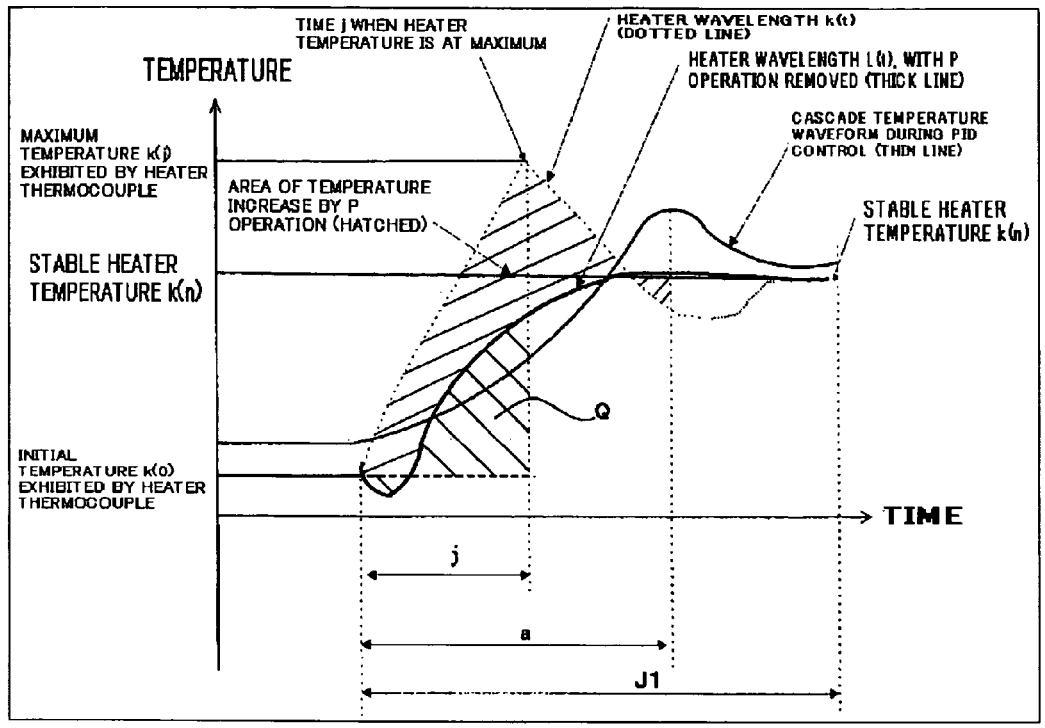
FIG. 12 is a view showing a heater waveform L(t) obtained by subtracting a portion corresponding to a P operation from the waveform of k(t) according to the first embodiment of the present invention.

Then, in a case where the overshoot value is not greater than a preset allowable overshoot value (S13, "No"), as shown in FIG. 12, a temperature adjustment estimation time J1 (min) from the start of power control is determined based on the temperature transition (temperature waveform) for the cascade thermocouple at the time of PID control acquired in the first step, and on the basis of basic data on temperature characteristics at the time of power control acquired in the third step. Also determined are the time "j" (min) of the maximum temperature exhibited by the heater thermocouple 2, as well as the time "n" (min) at which the temperature exhibited by the heater thermocouple 2 is sufficiently stabilized. Here, k(t) (° C.) represents the temperature (hereinafter, referred to also as heater waveform) exhibited by the heater thermocouple 2 at the time of power control for each moment during the temperature adjustment estimation time period J1, and m(t) (° C.) represents the temperature exhibited by the cascade thermocouple 3.

Figure 13:
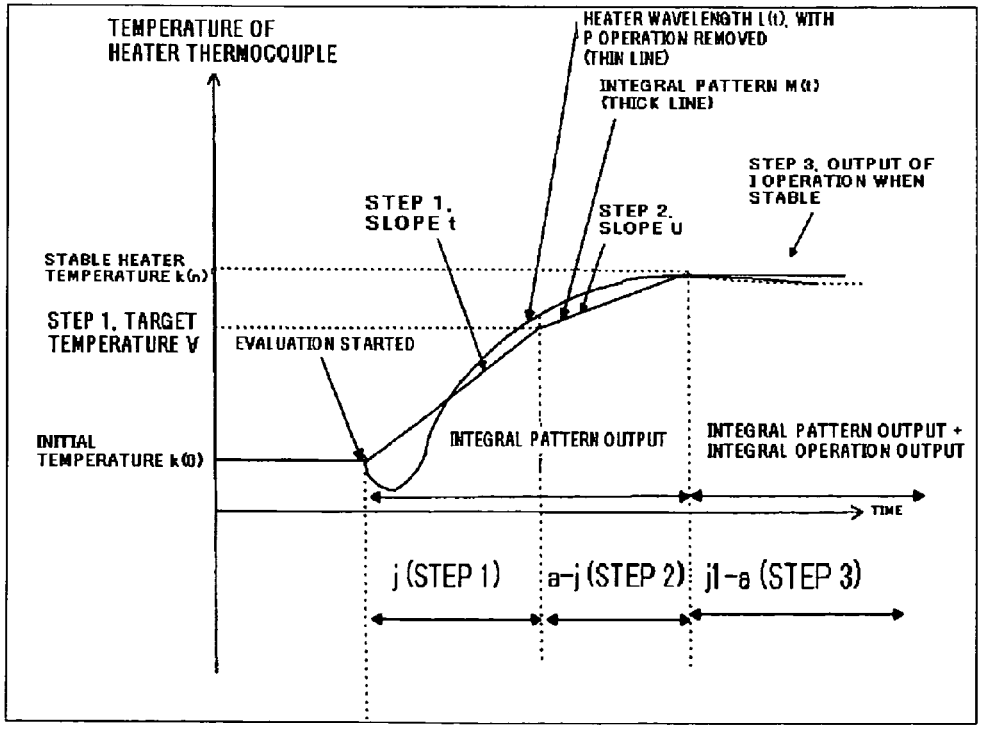
FIG. 13 is a view showing an integral output pattern M(t) according to the first embodiment of the present invention.

An integral output pattern M(t) such as the one shown in FIG. 13 is determined from this data on the basis of a heater waveform L(t) obtained by subtracting a portion corresponding to a P operation from the waveform of the temperature k(t) exhibited by the heater, thermocouple 2 at the time of power control as shown in FIG. 12 (fourth step) (S15).

The reason that the portion corresponding to a P (proportional) operation is subtracted here from the waveform of the temperature k(t) exhibited by the heater thermocouple 2 is that because a power output pattern is created and acquired based on the output calculated by a PID operation at the time of PID control, the waveform of k(t) is based on the sum total of a P (proportional) output, an I (integral) output, and a D (differential) output.

For this reason, a desired integral output pattern M(t) can be determined by subtracting the portion corresponding to the P and D outputs. Here, the D output can be ignored because the D output is usually extremely small during a temperature increase.

Then a determination is made of the heat quantity for a time period from the start of estimation until the time "j" at which the heater temperature exhibited by heater waveform k(t) reaches a maximum. The heat quantity is obtained by further subtracting k(0)·j from the heater temperature waveform L(t) obtained by subtracting the portion corresponding to a P operation. This amount is assumed to be Q. In Eq. (21), the integration range of ·L(t)dt lies between 0 and j.

$$Q = \int L(t)dt - k(0)j \quad (21)$$

The value Q is divided by the time "j" at which the heater temperature reaches a maximum, making it possible to determine a value M at which the heater temperature is a constant value M in a condition in which Q and the surface area (heat quantity) are the same in the period from the start of evaluation until time "j".

(Area (heat quantity) of a rectangle with bottom side j and height M=Surface area of Q (heat quantity))

$$M = Q/j \quad (22)$$

Doubling the value of M makes it possible to determine a triangle in which the height M*2 of the bottom side "j" is equal to the surface area (heat quantity) of Q. Using k(0)·j and the height and slope of the triangle makes it possible to obtain a suitable integral output pattern that yields a heat quantity identical to the heat quantity based on the temperature (hereinafter, also referred to as heater thermocouple temperature) exhibited by the heater thermocouple, but with the exclusion of the portion corresponding to the P operation exhibited by the heater thermocouple.

FIG. 13 shows step 1 as the period from the start of estimation until the time "j" at which the heater temperature exhibited by the heater thermocouple at the time of power control, and step 2 as the period from the time "j" of the maximum heater temperature (exhibited by the heater thermocouple) at the time of power control until the time a of the maximum cascade temperature at the time of PID control.

With regards to the temperature in step 1, using the height and slope of the above-described triangle yields a suitable integral output pattern in the period from the start of estimation until the time "j" at which the heater temperature exhibited by the heater thermocouple reaches a maximum at the time of at the time of power control. Specifically, the time at which the heater thermocouple reaches a maximum at the time of power control is a time at which the temperature detected by the heater thermocouple is no longer affected by the output needed to raise the temperature by heating with the heater, namely, by the heat quantity during a temperature increase, and it is suitable to prepare an integral output pattern so that the temperature increase is continued until that point in time.

The effects of variations in heating by the heater in terms of the temperature detected by the cascade thermocouple are no longer obtained at and past the time at which the temperature exhibited by the cascade thermocouple reaches a maximum at the time of PID control, which is the time at which step 2 is terminated. Namely, once the cascade temperature reaches the target temperature S' at this time, the target temperature S' becomes stable and free of any overshoot after that. Specifically, the time at which the temperature exhibited by the cascade thermocouple reaches a maximum is also a time at which the temperature detected by the cascade thermocouple is no longer affected by the output needed to raise the temperature by heating with the heater, namely, by the heat quantity during a temperature increase, and it is suitable to prepare an integral output pattern so that the temperature increase is continued until that point in time.

Therefore, in terms of the integral output pattern as well, a favorable integral output pattern may be prepared in step 2 by creating a pattern so as to obtain a stable output at the time at which the temperature detected by the cascade thermocouple at the time of PID control is at a maximum, and the integral output pattern may be produced so that there is a linear transition from the target temperature V of step 1 to the heater temperature k(n) at the time "n" at which the heater thermocouple is sufficiently stabilized. It is also possible to prepare a pattern in which the temperature detected by the cascade thermocouple reaches a maximum at the time of power control rather than at the time of PID control.

The following parameters shown in FIGS. 12 and 13 can be obtained using Eqs. (23) to (26) below: L(t) (° C.) (heater temperature less the portion corresponding to P), V (° C.) (target temperature of step 1 in FIG. 13), T (° C./min) (slope of step 1 in FIG. 13), and U (° C./min) (slope of step 2 in FIG. 13).

$$L(t)(° C.)$$
$$=(\text{Heater waveform}-\text{Output portion corresponding to } P \text{ operation})$$
$$=k(t)-\{P\text{-constant } Kp^*(\text{Target temperature } S'-\text{Cascade temperature } m(t) \text{ at time of power control})\} \quad (23)$$

From Eqs. (21) and (22), $$V(° C.)=(\int L(t)dt/j)\times 2 \quad (24)$$

$$T(° C./\min)=(V-k(0))/j \quad (25)$$

$$U(° C./\min)=(k(n)-V)/(a-j) \quad (26)$$

An integral output pattern is prepared using equations such as those shown above, and PIDC control is performed (S15). In Eq. (24), the integration range of ∫L(t)dt lies between 0 and j.

Specifically, the procedure involves setting initial and target values, rates, and time periods for each step as shown in FIG. 13, and providing outputs along these steps.

Improved Adjustment of Overshoot and Undershoot

The thermal processing system according to the present embodiment is provided with a function to adjust overshoots and undershoots in cases where considerable overshoots or undershoots occur in the above-described integral output pattern despite the implementation of PDIC control, or in cases where deviation between heating zones is significant and needs to be improved. For example, excessive integral operation values can be excluded by using an integral output pattern, but the timing for increasing the temperature is occasionally delayed by the effect thereof, and the proportional operation value and the like become excessively large. For this reason, cases may occur in which these parameters must be adjusted.

The improved adjustment of overshoot and undershoot will now be described. As described above, in the embodiment of the present invention, the integral output of a temperature transition period is made into a pattern, an integral output pattern is prepared so that the integral output quantity during a stable temperature period is brought to a level observed when stability is maintained, and temperature is adjusted in addition to the integral operation output. The reason that the integral operation output is used in a stable temperature period is that since adverse effects due to small embodiment variations such as unpredictable disturbances tend to be more pronounced than during a temperature increase, due to various slight temperature changes, an integral operation output can be used to overcome effects that cannot be overcome by an integral output pattern alone.

Namely, it is believed that in the temperature control shown in FIG. 13, for example, a stable period begins at step 3, and selecting zero as the value of the deviation between the target temperature S' and the temperature exhibited by the cascade thermocouple at the time of the switch between steps 2 and 3 stabilizes the temperature in the subsequent period and constitutes a suitable adjustment technique.

Accordingly, in a case in which an overshoot or undershoot arises (S16, Yes), the integral output pattern is corrected from the deviation between the target temperature S' and the temperature exhibited by the cascade thermocouple at the time of the switch (time at which the PID control is switched) between steps 2 and 3, and an adjustment is made so that the overshoot or undershoot is reduced (S17a).

Figure 14:
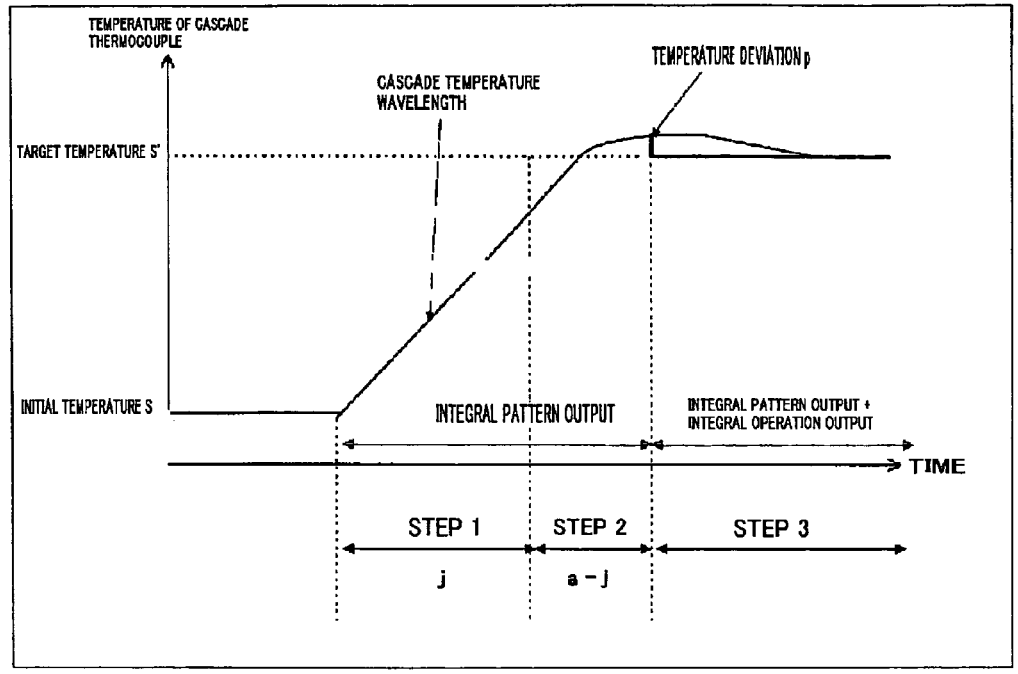
FIG. 14 is a view showing the occurrence of an overshoot and an undershoot in the case of a suitable integral output pattern according to the first embodiment of the present invention.

Let "p" be the deviation between the target temperature S' and the temperature exhibited by the cascade thermocouple at the time of the switch between steps 2 and 3 as shown in FIG. 14. The significant effect of the P output during a transitional period is presumed to be the reason that an overshoot or undershoot occurs regardless of the suitability of the integral output pattern. The P output W1, calculated from the deviation "p" at the time of the switch between steps 2 and 3, can be determined by Eq. (27) (*2), similar to Eq. (72).

$$W1=Kp\cdot p \quad (27)$$

Namely, the portion corresponding to the P output W1 is believed to be an excessive output and to appear as deviation "p" at the time of the switch between steps 1 and 2.

It is thus believed that an overshoot or undershoot can be improved by adjusting an excessive P output W1 in the integral output pattern.

Here, the temperature transition period encompasses steps 1 to 2, and the controlled variable of the temperature transition period, i.e., steps 1 to 2, can be adjusted to an appropriate value by subtracting the adjustment amount W1 from the target temperature V of step 1 and recalculating the slope T of step 1 and the slope U of step 2. Namely, the integral controlled variable of a temperature transition period is increased in the case of an undershoot and reduced in the case of an overshoot, making it possible to reduce the deviation between the target temperature S' and the temperature exhibited by the cascade thermocouple at the time of the switch between steps 2 and 3, and to improve the overshoot and undershoot.

After adjustment, the target temperature V' of step 1, the ramp-up rate T' of step 1, and the ramp-up rate U' of step 2 can be determined by Eqs. (28) to (30) below, where W1 is the adjustment amount, k(0) is the initial temperature of the integral output, V is the target temperature of step 1, "j" is the time of step 1, (a-j) is the time of step 2, and k(n) is the stable heater temperature (target temperature of step 3) is k(n), then.

$$V'=V-W1 \quad (28)$$

$$T'(° C./\min)=(V'-k(0))/j \quad (29)$$

$$U'(° C./\min)=(k(n)-V')/(a-j) \quad (30)$$

Improved Adjustment of Inter-Zonal Deviation

Figure 15:
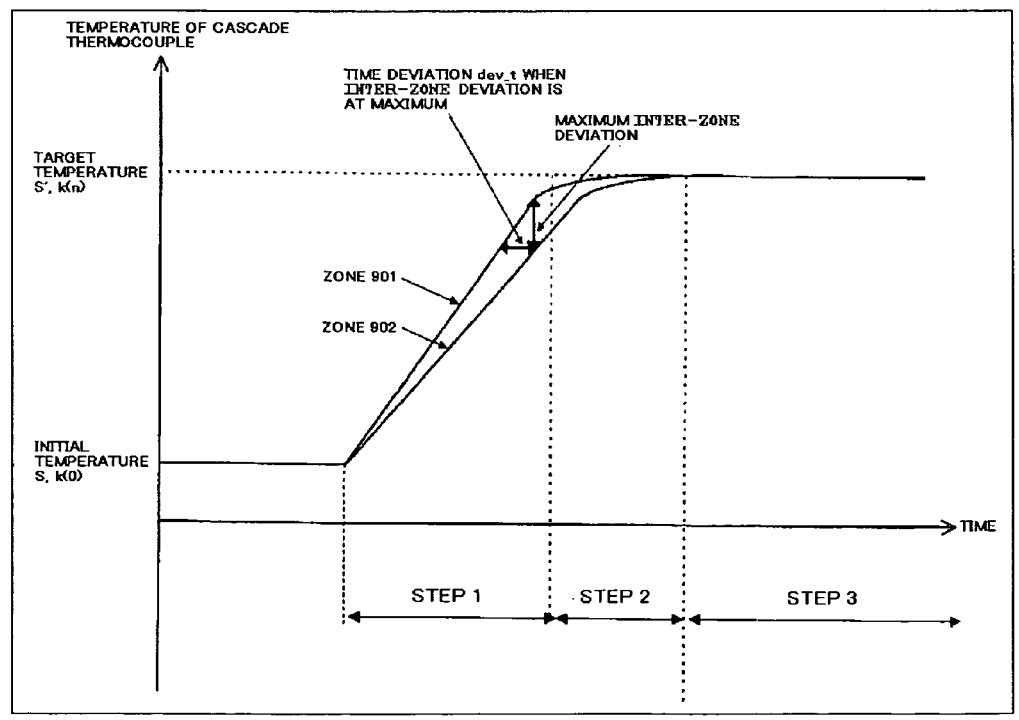
FIG. 15 is a view showing an inter-zonal deviation according to the first embodiment of the present invention.

As shown in FIG. 15, a controlled variable is created and adjusted for each heating zone even where temperature is appropriately adjusted. Therefore, rapid and slow zones are created in terms of achieving a stable target temperature, these differences create inter-zonal deviations, and these deviations sometimes affect the film thickness.

For this reason, in a case where an inter-zonal deviation is greater than a preset allowable value (S18, "Yes"), the zone that reaches the target temperature more rapidly is slowed down to match the slower zone by adjusting the integral output pattern, and the inter-zonal deviation is improved (S19).

A determination is made of the time deviation dev_t (min) at the time of maximum inter-zonal deviation between a zone 901 that reaches the target temperature more rapidly, and a zone 902 that reaches the target temperature more slowly.

In this determination, temperature B' of the zone 902 at the time of maximum inter-zonal deviation is first determined, and the difference between the time at which the zone 901 reaches the temperature B' and the time at which the inter-zonal deviation reaches a maximum is then determined as the time deviation dev_t.

Figure 16:
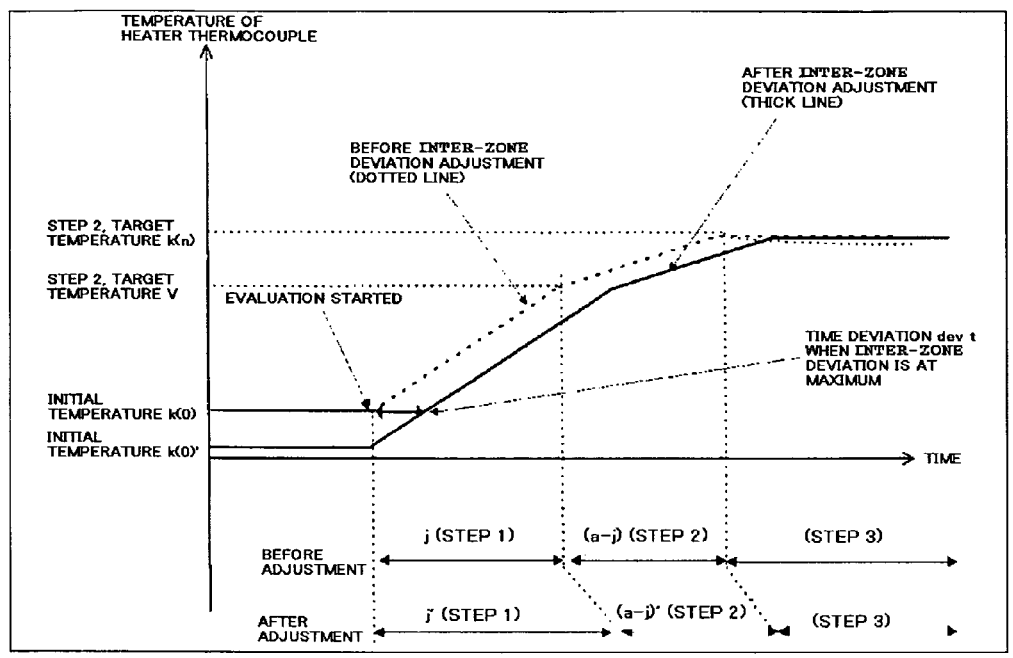
FIG. 16 is a view showing a temperature adjustment procedure for a case of an inter-zonal deviation according to the first embodiment of the present invention.

Stability of the target temperature is subsequently delayed to match the zone 902 by delaying each step of the integral output pattern of zone 901 by a value equal to dev_t, as shown in FIG. 16.

The parameters shown in FIG. 16 can be determined using the Eq. (31) and Eq. (32) below. Here, T is the above-described slope T (° C./min) of step 1.

$$a' = a + \text{dev}\_t \quad (31)$$

$$k(0)' = k(0) + T \cdot \text{dev}\_t \quad (32)$$

Delaying the integral output pattern by an amount equal to the time deviation dev_t makes it possible to delay the zone that reaches the target temperature more rapidly.

In a case where the inter-zonal deviation is not greater than a preset allowable value (S18, "No"), the temperature adjustment process is ended.

Thus, in the semiconductor manufacturing method according to the present embodiment, thermal processing is performed on a substrate by implementing a temperature control using the above-described second output control pattern as at least a part of the controlled variable for the heater.

Specifically, with the integral output patterns determined as described above, the high-level controller Uc sets an integral output patter for each of the heating zones in terms of an output value, a rate, and a time for each of the plurality of steps, and the switching time of the selector 44 is also set. The switching time of the selector 44 is set to a time at which a transition to stability is made after the temperature increased is completed (for example, to a time at which a transition is made from step 2 to step 3 in FIG. 16).

With the settings selected, the temperature is controlled and a substrate is processed using the PIDC operator 24, the PID operator 26, and the like. Specifically, the temperature control section 71 calculates the deviation F in the subtracter 21 by causing the control amount A from the cascade thermocouple 3 to be subtracted from the target value Sc (for example, the target temperature k(n) of step 2 in FIG. 16) during a temperature increase (for example, steps 1 and 2 in FIG. 16); calculates the controlled variable X in the proportional operator 42, differential operator 43, and integral pattern output circuit 45; then converts the controlled variable X into a target value X'; causes the control amount B from the heater thermocouple 2 to be subtracted in the subtracter 25; and outputs a deviation E. A PID operation is then performed using the deviation E in the PID operator 26, and a controlled variable Z is output as the output of the temperature control section 71 to control the heater 1.

The control amounts A and B that are output from the heater 1 are fed back again to the temperature control section 71. The controlled variable Z is thus controlled so that the deviation F between the target value Sc and the control amount A is zero. A switch is made by the selector 44 after the temperature increase is completed at the time of stability following completion of the temperature increase (for example, at step 3 in FIG. 16); deviation F is calculated in the subtracter 21 by causing the control amount A from the cascade thermocouple 3 to be subtracted from the target value Sc; the controlled variable X is calculated in the proportional operator 42 and the differential operator 43, as well as in the integral pattern output circuit 45 and the integral operator 41; the controlled variable X is then converted into a target value X'; the control amount B from the heater thermocouple 2 is subtracted in the subtracter 25; and a deviation E is output. A PID operation is then performed using the deviation E in the PID operator 26, and a controlled variable Z is output as the output of the temperature control section 71 to control the heater. The control amounts A and B that are output from the heater 1 are fed back again to the temperature control section 71. The controlled variable Z is thus controlled so that the deviation F between the target value Sc and the control amount A is zero. The substrate is thermally processed while the temperature is being controlled in this manner.

Second Embodiment

Operations to control and adjust the temperature are simplified by performing these operations using the above-described temperature control and adjustment method shown in the flowchart of FIG. 7. Even when this temperature control and adjustment method is used and operations to control and adjust the temperature have been completed, it is sometimes necessary to subsequently process a substrate under a different set of temperature-setting conditions. Even when the temperature is controlled and adjusted under a different set of temperature-setting conditions, the temperature control and adjustment method shown in the flowchart in FIG. 7 is an effective method that allows the temperature to be controlled and adjusted with high precision and overshoots to be reduced. There are, however, cases in which, of all the temperature-setting conditions, only the processing temperature (target temperature) in the processing chamber at the time of substrate processing is made different from the temperature-setting conditions used for an already completed operation to control and adjust the temperature; cases in which only the ramp-up rate of a temperature increase (occasionally referred to hereinbelow as the temperature increase rate) during a temperature increase to the processing temperature (target temperature) in the processing chamber at the time of substrate processing is made different from the temperature-setting conditions used for an already completed operation to control and adjust the temperature; and other cases in which, of all the temperature-setting conditions, only one or two temperature-setting conditions are made different from the temperature-setting conditions used for an already completed operation to control and adjust the temperature. Performing the above-described temperature control and adjustment method shown in the flowchart in FIG. 7 from the very beginning extends the process by an extraneous amount of time needed to perform the temperature control and adjustment method from the very beginning and does not necessarily make this method efficient.

In cases in which, of all such temperature-setting conditions required for a subsequent cycle, only one or two temperature-setting conditions are made different from the temperature-setting conditions used for an already completed operation to control and adjust the temperature, it is possible to complete the operation to control and adjust the temperature under the temperature-setting conditions required for the subsequent cycle by correcting the already completed operation to control and adjust the temperature so that the portion containing the different temperature-setting conditions is included in the adjustment. Such a correction is an effective technique that allows an approximate operation to control and adjust the temperature to be performed with ease while reducing the adjustment time.

Specifically, an integral output pattern is determined in the above-described temperature control and adjustment method shown in the flowchart in FIG. 7 when a portion containing different temperature-setting conditions is included in corrections. The integral output pattern is output instead of an integral operator during a temperature increase. Therefore, the integral output pattern is corrected in accordance with the changes in the temperature-setting conditions, whereby the operation to control and adjust the temperature under the temperature-setting conditions required for the subsequent cycle is completed (fifth step).

Example 1

Described below is a case which a change is made only in the temperature gradient, i.e., the ramp-up rate of a temperature increase, from the desired temperature until the temperature inside the reaction tube reaches the target temperature.

Figure 17:
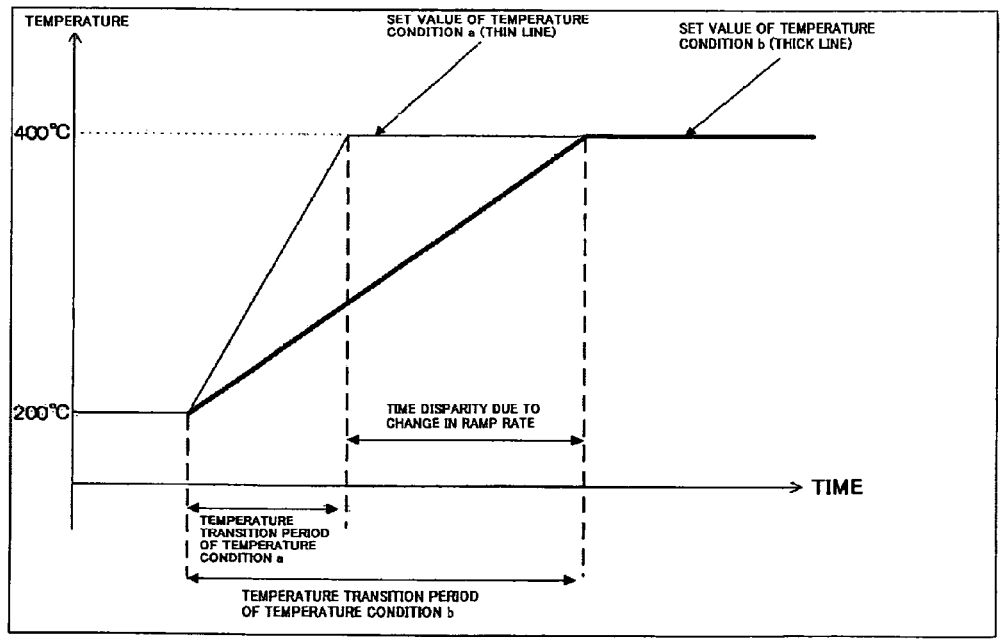
FIG. 17 is a view showing a specific version of example 1 according to a second embodiment of the present invention.

A case will now be considered in which the above-described temperature control and adjustment method shown in the flowchart of FIG. 7 is used to adjust a set a of temperature-setting conditions selected so that the temperature at the start of a temperature increase is 200° C., the target temperature is 400° C., and the ramp-up rate of the temperature increase from 200° C. to 400° C. is 50° C./min; and in which an integral output pattern such as the one shown in FIG. 17 is determined.

A case will also be considered in which the goal is to control the temperature in a subsequent cycle under conditions in which only the ramp-up rate during a temperature increase is different, i.e., under a set b of temperature-setting conditions selected so that the temperature at the start of a temperature increase and the target temperature are the same, 200° C. and 400° C., respectively, and solely the ramp-up rate from 200° C. to 400° C. was 50° C./min is changed to 20° C./min; and in which the temperature is adjusted using the integral output pattern determined under the above-described set a of temperature-setting conditions.

Here, when the integral output pattern determined under set a of temperature-setting conditions is used unchanged to control the temperature under set b of temperature-setting conditions, the interval from 200° C. to 400° C. is a time at which operations are performed on the basis of an output from the integral output pattern, an output from a differential operation, and an output from a proportional operation. At this time, the output from the differential operation during the temperature increase is negligible and can therefore be safely ignored, but there is a marked effect on the output, particularly that from the proportional operation. For this reason, there will be a tendency for the output from the proportional operation to be controlled at the ramp-up rate of 20° C./min, and it will therefore become impossible to reach the target temperature in proportion to the reduction in the output from the proportional operation in the period between steps 2 and 3 of the control method that includes the integral output pattern determined under set a of temperature-setting conditions, i.e., at the time at which the target temperature is to reached under set a of temperature-setting conditions. The output from the integral operation and the output from the differential operation are added to the output from the proportional operation, and the output from the integral operation is implemented after the target temperature has been reached under set a of temperature-setting conditions. Therefore, an overshoot that significantly exceeds the target temperature is generated by the output from the integral operation in addition to the output from the proportional operation, the time required for achieving stability at the target temperature is increased, and excessive temperature is ultimately applied to the wafer.

Namely, it is believed to be necessary to perform an adjustment in which the temperature transition period is extended by reducing the ramp-up rate under set b of temperature-setting conditions in comparison with set a of temperature-setting conditions, and there is a delay in the time at which a switch is made from step 2 to step 3 in order to achieve stability at the target temperature. In terms of the integral output pattern, step 1 is the time that contributes the most to raising the temperature during a temperature increase, but because step 1 is the time during which adjustments are made under set a of temperature-setting conditions, the time in step 1 is too short under set b of temperature-setting conditions, and the controlled variable is believed to be insufficient.

Therefore, as shown in FIG. 17, the time in step 1 is adjusted based on the disparity in the times corresponding to the temperature transition periods according to the ramp-up rate under sets a and b of temperature-setting conditions (the time disparity due to a change in the ramp-up rate).

The adjustment time time_tuning_1 (min) for the time in step 1 is determined from Eq. (33) below, where the ramp-up rate under set a of temperature-setting conditions is ramp_a (° C./min), the ramp-up rate under set b of temperature-setting conditions is ramp_b (° C./min), and the temperature deviation for the temperature increase under both set a and set b of temperature-setting conditions is temp_diff (° C.).

$$\text{time\_tuning\_1} = \text{temp\_diff} * (\text{ramp\_a} - \text{ramp\_b}) / (\text{ramp\_a} * \text{ramp\_b}) \qquad (33)$$

Specifically, the following determination is made.

$$\text{temp\_diff} = 400(° C.) - 200(° C.) = 200(° C.)$$

$$\text{time\_tuning\_1} = 200(° C.) * (50(° C./min) - 20(° C./min)) / (20(° C./min) * 50(° C./min)) = 6(\min)$$

The adjustment time determined by the above equation is added to the time in step 1. time1_b is determined by Eq. (34) below, where time1_a represents the time in step 1 for the controlled variable pattern adjusted under set a of temperature-setting conditions, and time1_b represents the time in step 1 for the controlled variable pattern adjusted using an embodiment of the present invention under set b of temperature-setting conditions.

$$\text{time1\_b} = \text{time1\_a} + \text{time\_tuning\_1} \qquad (34)$$

Specifically, the following determination is made.

$$\text{time1\_b} = \text{time1\_a} + 6 \text{ (min)}$$

Figure 18:
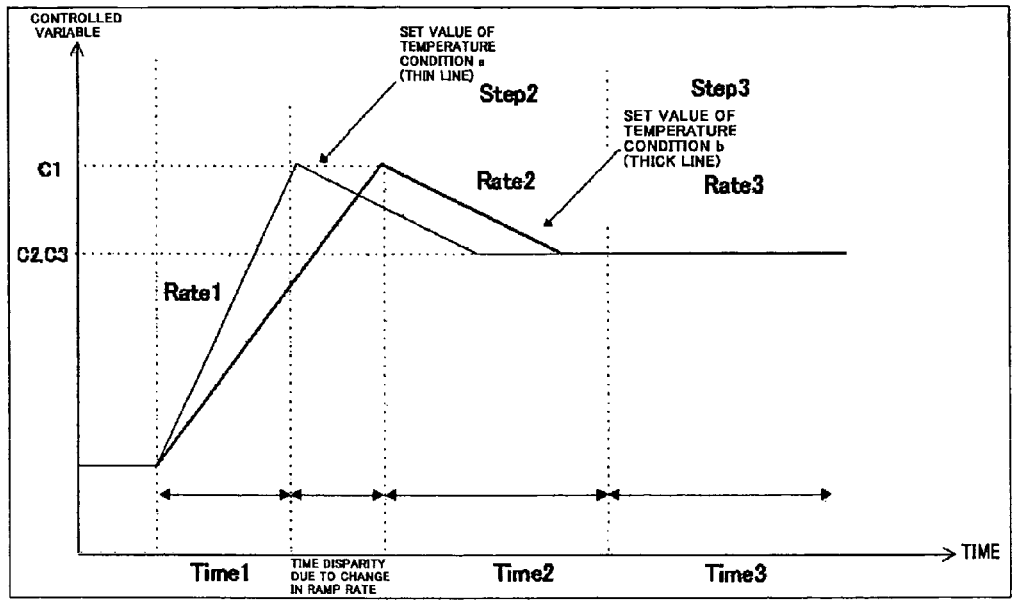
FIG. 18 is a view showing an adjusted integral output pattern in example 1 according to the second embodiment of the present invention.

Based on the above equation, 6 (min) may be added as the time in step 1 to allow the controlled variable pattern adjusted under set a of temperature-setting conditions to be used under set b of temperature-setting conditions. FIG. 18 shows an example of the adjusted controlled variable pattern.

By adjusting the controlled variable pattern according to the differential in the ramp-up rate in this manner, it is possible to reduce the time needed to adjust the temperature under similar temperature-setting conditions, such as sets a and b of temperature-setting conditions.

A case where the ramp-up rate was reduced was described above as an example, but a case where the ramp-up rate is increased can also be handled by making corrections in a similar manner.

Example 2

Following is a description of a case where the temperature is automatically adjusted in the same manner by using a control table in which an adjustment is completed under set a of temperature-setting conditions as described above. In this case, the goal is to control the temperature in a subsequent cycle under conditions that differ only in the target temperature established after an increase in temperature; for example, under set c of temperature-setting conditions in which the ramp-up rate from the temperature at the start of a temperature increase up to the target temperature is the same 50° C./min, the temperature at the start of the temperature increase is the same 200° C., and only the target temperature is different at 350° C.

Figure 19:
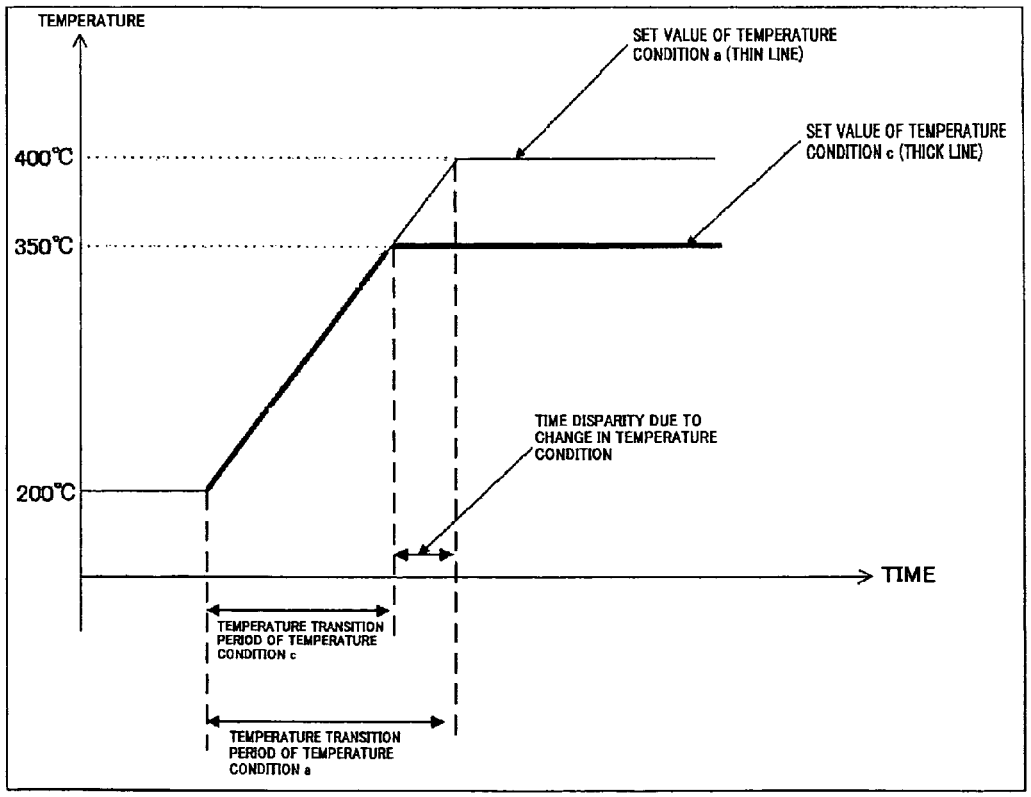
FIG. 19 is a view showing a specific version of example 2 according to the second embodiment of the present invention.

Table A shows a controlled variable pattern output such as the one in FIG. 19. The temperature-setting conditions of the present example are assumed to correspond to set c of temperature-setting conditions. It is believed that the temperature in the interior of the reaction tube has already reached the target temperature, and a significant overshoot occurs at the time there is a switch between steps 2 and 3 in a case where Table A is used and the program is run under set c" of temperature-setting conditions.

The reason is that the target temperature under set c of temperature-setting conditions is lower than under set a of temperature-setting conditions, whereby the temperature transition period is reduced and, as a result, the time of the switch between steps 2 and 3, which is the time at which the temperature in the interior of the reaction tube becomes stable at maximum speed, occurs earlier.

The controlled variable in step 1, which is the temperature transition period, is a controlled variable that has been adjusted under set a of temperature-setting conditions. Therefore, the time in step 1 is considered to be long and the controlled variable to be excessive under set b of temperature-setting conditions.

The controlled variable in steps 2 and 3, which are stable periods, is the heater temperature at the time the target temperature is stable. Compared, however, with the stable heater temperature under set c of temperature-setting conditions, the stable heater temperature under set a of temperature-setting conditions is such that the target temperature under set c of temperature-setting conditions is lower than under set a of temperature-setting conditions, and the controlled variable is therefore believed to be excessive.

Figure 20:
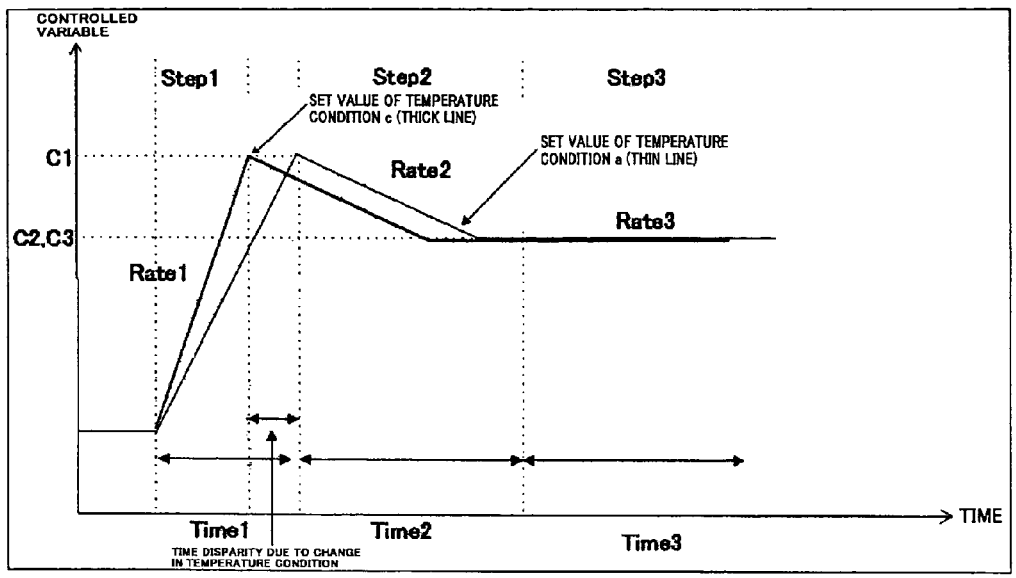
FIG. 20 is a view showing an adjusted integral output pattern in example 2 according to the second embodiment of the present invention.

Therefore, the time in step 1 is adjusted based on the disparity in the target temperature during the temperature transition period under sets a and c of temperature-setting conditions (disparity in time due to a change in temperature conditions) such as those shown in FIG. 20.

The adjustment time for the time in step 1, time_tuning_2 (min), can be determined using Eq. (35) below, where the ramp-up rate common to sets a and the c of temperature-setting conditions is ramp(° C./min), the temperature deviation during a temperature increase under set a of temperature-setting conditions is temp_diff_a (° C.), and the temperature deviation during a temperature increase under set c of temperature-setting conditions is temp_diff_c (° C.).

$$\text{time\_tuning\_2} = (\text{temp\_diff\_}c - \text{temp\_diff\_}a)/\text{ramp} \tag{35}$$

Specifically, $$\text{temp\_diff\_}a = 400(°\text{ C.}) - 200(°\text{ C.}) = 200(°\text{ C.})$$

$$\text{temp\_diff\_}c = 350(°\text{ C.}) - 200(°\text{ C.}) = 150(°\text{ C.})$$

$$\text{time\_tuning\_2} = (150(°\text{ C.}) - 200(°\text{ C.}))/50(°\text{ C./min}) = -1(\text{min})$$

The adjusted time and adjusted controlled variable determined by the above equations are added to the controlled variable and time of step 1.

It is possible to determine time1_c by using the following equation, where the time in step 1 for the controlled variable pattern adjusted under set a of temperature-setting conditions is time1_a, and the time in step 1 for the controlled variable pattern adjusted by using an embodiment of the present invention under set c of temperature-setting conditions is time1_c.

$$\text{time1\_}c = \text{time1\_}a + \text{time\_tuning\_2} \tag{36}$$

Specifically, $$\text{time1\_}c = \text{time1\_}a + (-1) \text{ (min)}$$

An adjustment is subsequently made to the excess or deficiency of the controlled variable brought about by the target temperatures under sets a and c of temperature-setting conditions such as those shown in FIG. 21. The adjusted controlled variable in step 1, temp_tuning_2(° C.), can be determined using Eq. (37) below, where the temperature deviation during a temperature increase under set a of temperature-setting conditions is temp_diff_a(° C.), and the temperature deviation during a temperature increase under set c of temperature-setting conditions is temp_diff_c(° C.).

$$\text{temp\_tuning\_2} = (\text{temp\_diff\_}c - \text{temp\_diff\_}a) \tag{37}$$

Specifically, $$\text{temp\_diff\_}a = 400(°\text{ C.}) - 200(°\text{ C.}) = 200(°\text{ C.})$$

$$\text{temp\_diff\_}c = 350(°\text{ C.}) - 200(°\text{ C.}) = 150(°\text{ C.})$$

$$\text{temp\_tuning\_2} = (150(°\text{ C.}) - 200(°\text{ C.})) = -50(°\text{ C.})$$

The adjusted controlled variable determined by the above equation is added to the controlled variable of step 1.

C1_c can be determined by Eq. (38) below, where the controlled variable in step 1 for the controlled variable pattern adjusted under set a of temperature-setting conditions is C1_a, and the controlled variable in step 1 for the controlled variable pattern adjusted by using an embodiment of the present invention under set c of temperature-setting conditions is C1_c.

$$C1\_c = C1\_a + \text{temp\_tuning\_2} \tag{38}$$

Specifically, $$C1\_c = C1\_a + (-50)(°\text{ C.})$$

The temp_tuning_2 for the controlled variables of steps 2 and 3 is adjusted in the same manner as in step 1. C2_c and C3_c can be determined using Eqs. (39) and (40) below, where C2_a is the controlled variable in step 3 for a controlled variable pattern adjusted under set a of temperature-setting conditions, C3_a is the controlled variable of step 3, C2_c is the controlled variable in step 2 for the controlled variable pattern adjusted by using an embodiment of the present invention under set c of temperature-setting conditions, and C3_c is the controlled variable of step 3.

$$C2\_c = C2\_a + \text{temp\_tuning\_2} \tag{39}$$

$$C3\_c = C3\_a + \text{temp\_tuning\_2} \tag{40}$$

Figure 21:
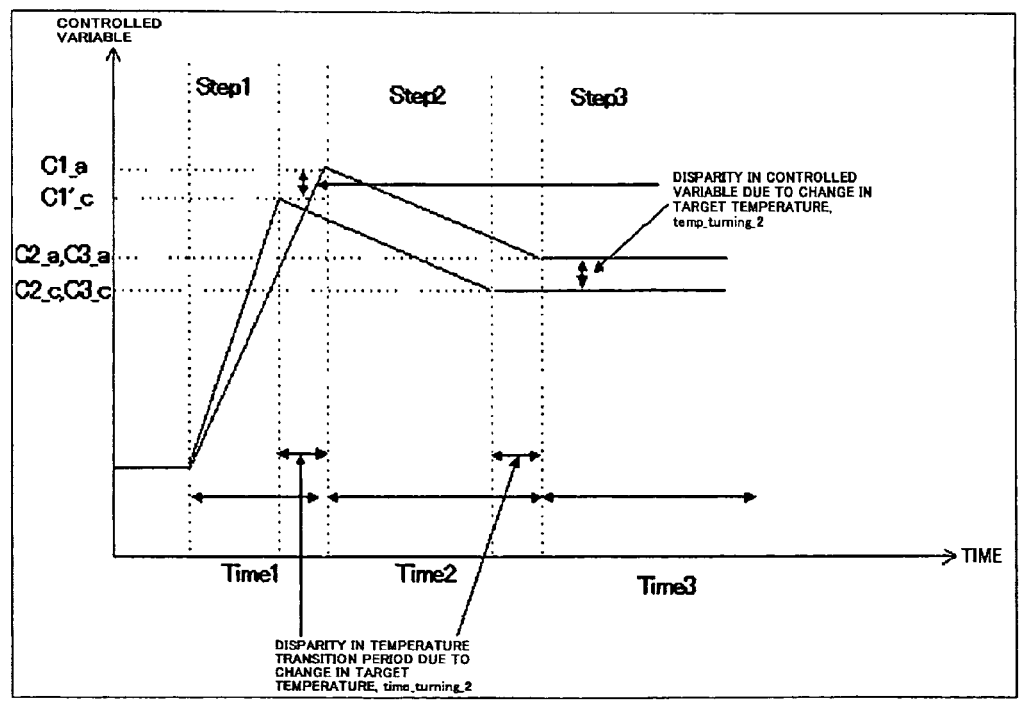
FIG. 21 is a view showing an adjusted integral output pattern in example 2 according to the second embodiment of the present invention.

As shown in FIG. 21, the above approach can be applied to set c of temperature-setting conditions by using a controlled variable pattern determined by adjusting the time of the temperature transition period and adjusting the controlled variable based on changes in the target temperature.

Adjusting the controlled variable pattern according to the differential in the target temperature in this manner makes it possible to reduce the time needed to adjust the temperature under similar temperature-setting conditions, such as sets a and c of temperature-setting conditions.

A case where the ramp-up rate was reduced was described above as an example, but a case where the ramp-up rate is increased can also be handled by making corrections in a similar manner.

Effect of the Embodiments

According to the above-described embodiments, operations to adjust the temperature can be performed rapidly and reliably in response to changes or numerous adjustments to temperature-setting conditions, making it possible to reduce time and cost.

The temperature control method configured as described above may also be used to make automatic adjustments and to bring a controlled variable to an optimum level by being repeatedly executed a number of times. It is apparent that the temperature control method configured as described above can also be made into a program and executed on a computer.

It is also possible to adopt an approach in which an output control pattern is created based on an output quantity resulting from a PID operation, and the portion corresponding to the P operation is subtracted, in order to determine the portion corresponding to an I operation, from the temperature waveform detected by a heater thermocouple when the output of the heater in the output control pattern is controlled (not only the portion corresponding to the P operation, but also the portion corresponding to a D operation can be subtracted), making it possible to more efficiently determine an integral output pattern that is closer to the temperature waveform detected by the heater thermocouple and reduced by the subtraction.

Although the embodiments described above illustrate examples in which the present invention is applied to a vertical type system, it is apparent that the present invention is not limited by these examples and can be applied to a single-wafer system or a horizontal type system.

In the procedures used in the embodiments of the present invention, most of the natural indicators for which the experience and skill of an expert are conventionally required when temperature adjustments are made, such as temperature measurements, controlled variables, and time, can be determined using predetermined formulas; the temperature adjustments can be made rapidly and reliably; and time and expense can be reduced.

Intervention by an operator can also be dispensed with and suitable temperature adjustments can be made by making the procedures used in the embodiment of the present invention into a program and loading the resulting software into the temperature controllers and the like.

What is claimed is:

1. A temperature adjustment method in a thermal processing system, the thermal processing system including: a heating unit for heating inside a processing chamber for processing a substrate, a heating control section for controlling the heating unit, and first and second temperature detecting units for detecting a temperature inside the processing chamber, the first temperature detecting unit being arranged at a position closer to the substrate than a position of the second temperature detecting unit, and the said second temperature detecting unit being arranged at a position closer to the heating unit than a position of the first temperature detecting unit, the temperature adjustment method comprising:

a step of determining a first heat quantity in a period from a start of a temperature increase detected by the second temperature detecting unit to a time at which the temperature inside the processing chamber reaches a maximum temperature, when a control of the thermal processing system is performed based on a first output control pattern that is obtained by subjecting a detection temperature provided by the first temperature detecting unit to an integral operation, a differential operation, and a proportional operation under a condition of a first set of temperature-setting conditions;

a step of determining a second output control pattern by using a second heat quantity that is obtained by subtracting an output provided by the proportional operation from the first heat quantity; and a step of correcting a portion of the second output control pattern corresponding to a condition which is different from the first set of temperature-setting conditions, of a second set of temperature-setting conditions in a subsequent temperature control cycle, when at least one condition of the second set of temperature-setting conditions is different from the first set of temperature-setting conditions.

2. The temperature adjustment method according to claim 1, wherein the correcting step includes correcting a portion of the second output control pattern corresponding to a condition which is different from the first set of temperature-setting conditions, of a second set of temperature-setting conditions, when at least one or two conditions of the second set of temperature-setting conditions in the subsequent temperature control cycle are different from the first set of temperature-setting conditions.

3. The temperature adjustment method according to claim 2, wherein at least one condition of the different conditions is a target temperature inside the processing chamber.

4. The temperature adjustment method according to claim 2, wherein at least one condition of the different conditions is a temperature gradient inside the processing chamber.

5. The temperature adjustment method according to claim 2, further comprising:

a step of correcting a first target temperature under the first set of temperature-setting conditions to a second target temperature and correcting the temperature gradient of the second output control pattern so as to correspond to the second target temperature under the second set of temperature-setting conditions, when at least one condition of the different conditions is a target temperature.

6. A temperature adjustment method according to claim 2, further comprising:

a step of correcting a first temperature gradient under the first set of temperature-setting conditions to a second temperature gradient, when at least one condition of the different conditions is a temperature gradient.

7. A method for manufacturing a semiconductor device to be processed using the temperature adjustment method in the thermal processing system according to claim 1, comprising;

a step of processing a substrate loaded into the processing chamber, while controlling the heating unit by using the second output control pattern corrected by the heating control section.

8. A method for manufacturing a semiconductor device to be processed using the temperature adjustment method in the thermal processing system according to claim 2, comprising;

a step of processing a substrate loaded into the processing chamber, while controlling the heating unit by using the second output control pattern corrected by the heating control section.

9. A thermal processing system comprising:
a heating unit for heating inside a processing chamber for processing a substrate;
a heating control section for controlling the heating unit; and
first and second temperature detecting units for detecting a temperature inside the processing chamber, the first temperature detecting unit being arranged at a position closer to the substrate than that of the second temperature detecting unit and the second temperature detecting unit being arranged at a position closer to the heating unit than that of the first temperature detecting unit, wherein
when a control of the thermal processing system is performed based on a first output control pattern that is obtained by subjecting a detection temperature provided by the first temperature detecting unit to an integral operation, a differential operation, and a proportional operation under a condition of a first set of temperature-setting conditions, the heating control section determines a first heat quantity in a period from a start of a temperature increase detected by the second temperature detecting unit to a time at which the temperature inside the processing chamber reaches a maximum temperature, and obtains a second output control pattern by using a second heat quantity that is obtained by subtracting an output provided by the proportional operation from the first heat quantity; and wherein
when at least one condition of a second set of temperature-setting conditions in a subsequent temperature control cycle is different from the first set of temperature-setting conditions, a portion of the second output control pattern corresponding to the different condition is corrected.

10. The thermal processing system according to claim 9, wherein,
when one or two conditions of the second set of temperature-setting conditions in the subsequent temperature control cycle are different the first set of temperature-setting conditions, the heating control section corrects a portion of the second output control pattern corresponding to the one or two conditions of the second set of temperature-setting conditions.

11. The thermal processing system according to claim 10, wherein
at least one condition of the different conditions is a target temperature inside the processing chamber.

12. The thermal processing system according to claim 10, wherein
at least one condition of the different conditions is a temperature gradient inside the processing chamber.

13. The thermal processing system according to claim 10, wherein
when at least one condition of the different conditions is a target temperature, the heating control section corrects a first target temperature under the first set of temperature-setting conditions to a second target temperature and the temperature gradient of the second output control pattern so as to correspond to the second target temperature under the second set of temperature-setting conditions.

14. The thermal processing system according to claim 10, wherein
when at least one condition of the different conditions is a temperature gradient, the heating control section corrects a first temperature gradient under the first set of temperature-setting conditions to a second temperature gradient.

15. A method for manufacturing a semiconductor device in a thermal processing system including a heating unit for heating inside a processing chamber for processing a substrate, a heating control section for controlling the heating unit, and first and second temperature detecting units for detecting a temperature inside the processing chamber, the first temperature detecting unit being arranged at a position closer to the substrate than that of the second temperature detecting unit, the second temperature detecting unit being arranged at a position closer to the heating unit than that of the first temperature detecting unit, the method for manufacturing a semiconductor device comprising:
a step of determining a first heat quantity in a period from a start of a temperature increase detected by the second temperature detecting unit to a time at which the temperature inside the processing chamber reaches a maximum temperature, when a control of the thermal processing system is performed based on a first output control pattern that is obtained by subjecting a detection temperature provided by the first temperature detecting unit to an integral operation, a differential operation, and a proportional operation under a condition of a first set of temperature-setting conditions;
a step of determining second output control pattern by using a second heat quantity that is obtained by subtracting an output provided by the proportional operation from the first heat quantity;
a step of correcting a portion of the second output control pattern corresponding to a condition which is different from the first set of temperature-setting conditions, of a second set of temperature-setting conditions in a subsequent temperature control cycle, when at least one condition of the second set of temperature-setting conditions is different from the first set of temperature-setting conditions; and
a step of processing the substrate loaded into the processing chamber while controlling the heating unit by using the second output control pattern corrected by the heating control section.

16. The method for manufacturing a semiconductor device according to claim 15, wherein
the correcting step includes correcting a portion of the second output control pattern corresponding to a condition which is different from the first set of temperature-setting conditions, of a second set of temperature-setting conditions, when at least one or two conditions of the second set of temperature-setting conditions in the subsequent temperature control cycle are different from the first set of temperature-setting conditions.

17. The method for manufacturing a semiconductor device according to claim 16, wherein
at least one condition of the different conditions is a target temperature inside the processing chamber.

18. The method for manufacturing a semiconductor device according to claim 16, wherein
at least one condition of the different conditions is a temperature gradient inside the processing chamber.

19. The method for manufacturing a semiconductor device according to claim 16, further comprising:
a step of correcting a first target temperature under the first set of temperature-setting conditions to a second target temperature, and correcting the temperature gradient of the second output control pattern so as to correspond to the second target temperature under the second set of temperature-setting conditions, when at least one condition of the different conditions is a target temperature.

20. The method for manufacturing a semiconductor device according to claim 16, further comprising:
   a step of correcting a first temperature gradient under the first set of temperature-setting conditions to a second temperature gradient, when at least one condition of the different conditions is a temperature gradient.

* * * * *